United States Patent
Park et al.

(10) Patent No.: US 7,508,732 B2
(45) Date of Patent: Mar. 24, 2009

(54) MULTI-BIT FLASH MEMORY DEVICE INCLUDING MEMORY CELLS STORING DIFFERENT NUMBERS OF BITS

(75) Inventors: Ki-Tae Park, Seongnam-si (KR); Yeong-Taek Lee, Songpa-gu (KR); Ki-Nam Kim, Gangnam-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 11/657,642

(22) Filed: Jan. 25, 2007

(65) Prior Publication Data
US 2008/0112221 A1    May 15, 2008

(30) Foreign Application Priority Data
Oct. 26, 2006    (KR) .................. 10-2006-0104611

(51) Int. Cl.
*G11C 13/04* (2006.01)
(52) U.S. Cl. ............. 365/235; 365/185.17; 365/189.05; 365/189.2; 365/230.08; 365/238.5
(58) Field of Classification Search ............. 365/235, 365/185.17, 189.05, 189.2, 230.08, 238.5
See application file for complete search history.

(56) References Cited

U.S. PATENT DOCUMENTS

| | | | |
|---|---|---|---|
| 5,847,992 A | 12/1998 | Tanaka et al. | |
| 6,987,693 B2 | 1/2006 | Cernea et al. | |
| 2003/0043628 A1* | 3/2003 | Lee | 365/185.17 |
| 2006/0015687 A1* | 1/2006 | Kim et al. | 711/128 |
| 2006/0215453 A1* | 9/2006 | Seong | 365/185.12 |
| 2007/0028155 A1* | 2/2007 | Kim et al. | 714/755 |

FOREIGN PATENT DOCUMENTS

| KR | 1020030023349 A | 3/2003 |
|---|---|---|
| KR | 1020050027037 A | 3/2005 |

* cited by examiner

*Primary Examiner*—Thong Q Le
(74) *Attorney, Agent, or Firm*—Volentine & Whitt, PLLC

(57) ABSTRACT

A flash memory device comprises an array of memory cells capable of storing different numbers of bits per cell. A page buffer circuit for the flash memory device comprises a plurality of page buffers, each operating during programming, erasing, and reading operations of the memory cells. A control logic unit controls functions of the page buffers in accordance with the number of bits stored in corresponding memory cells.

29 Claims, 19 Drawing Sheets

Fig. 4

| Page/Block | 64 | 128 | | | | 256 | | | |
|---|---|---|---|---|---|---|---|---|---|
| Dummy Cell | 2 | | 1 | 1 | 2 | | 1 | 1 | 2 |
| 1 bit/Cell (2-level SLC) | 20 | | | | | | | | |
| 1.5 bit/Cell (3-level SLC) | | | 42 | 42 | 42 | | | | |
| 2 bit/Cell (4-level MLC) | | 2 | | | | 2 | | | |
| 2.5 bit/Cell (6-level MLC) | | 24 | | | | 50 | 1 | | |
| 3 bit/Cell (8-level MLC) | | 20 | | | | | 42 | 42 | 42 |
| # of cell in string | 22 | 26 | 43 | 44 | 45 | 52 | 43 | 44 | 45 |

Fig. 10

|  | Latch1 | Latch2 |
|---|---|---|
| 1 bit/Cell (2-level SLC) | PGM/Read (e/o) | Cache |
| 1.5 bit/Cell (3-level SLC) | PGM/Read (cell-1) | PGM/Read (cell-2) |
| 2 bit/Cell (4-level MLC) | PGM/Read (e/o) | Previous Bit |
| 2.5 bit/Cell (6-level MLC) | PGM/Read (cell-1/2) | Previous Bit |
| 3 bit/Cell (8-level MLC) | PGM/Read (e/o) | Previous Bit |

Fig. 17

|  | Latch1 | Latch2 | Latch3 |
|---|---|---|---|
| 1 bit/Cell (2-level SLC) | PGM/Read (e/o) | Cache | — |
| 1.5 bit/Cell (3-level SLC) | PGM/Read (cell-1) | PGM/Read (cell-2) | Cache |
| 2 bit/Cell (4-level MLC) | PGM/Read (e/o) | Previous Bit | Cache |
| 2.5 bit/Cell (6-level MLC) | PGM/Read (cell-1) | PGM/Read (cell-2) | 1st/2nd Page Bit |
| 3 bit/Cell (8-level MLC) | PGM/Read (e/o) | Previous Bit | Cache |

US 7,508,732 B2

MULTI-BIT FLASH MEMORY DEVICE INCLUDING MEMORY CELLS STORING DIFFERENT NUMBERS OF BITS

BACKGROUND OF THE INVENTION

1. Field of the Invention

Embodiments of the invention relate generally to semiconductor memory devices. More particularly, embodiments of the invention relate to multi-bit flash memory devices.

A claim of priority is made to Korean Patent Application No. 2006-104611 filed on Oct. 26, 2006, the disclosure of which is hereby incorporated by reference in its entirety.

2. Description of Related Art

Semiconductor memory devices can be roughly divided into two categories: volatile and nonvolatile semiconductor memory devices. Volatile semiconductor memory devices often have higher operating frequencies than nonvolatile semiconductor memory devices, but they lose stored data when disconnected from an external power supply. On the other hand, nonvolatile memory devices tend to operate more slowly than volatile semiconductor memory devices, but can retain stored information even when disconnected from an external power supply. Due to this ability to retain stored data in the absence of external power, nonvolatile memory devices are often included in devices where power is limited or may be cut off unexpectedly, such as in portable electronic devices.

There are many different kinds of nonvolatile memory devices, including, for example, masked read-only memory (MROM), programmable ROM (PROM), erasable and programmable ROM (EPROM), and electrically erasable and programmable ROM (EEPROM). Unfortunately, however, it is relatively difficult to update stored data in MROMs, PROMs and EPROMs. As a result, these types of memories are most useful in applications where data is rarely, if ever, updated. In contrast, EEPROMs are commonly employed in a wide variety of applications because they allow programmers to update data frequently using electrical read, programming, and erase procedures.

One especially popular form of EEPROM is flash memory. Relative to other types of EEPROMS, flash memory is very popular due at least to its high degree of integration, low power consumption, and high resistance to physical shock. Because of these and other advantages, researchers continue to devote significant resources to the further development of flash memory technology. As an example of one relatively recent development, researchers have sought to increase the integration density of flash memory by designing flash memory cells capable of storing more than one bit. Such memory cells are commonly referred to as multi-level cells (MLCs) or multi-bit cells.

Like one bit flash memory cells, multi-level cells store data in relation to distinct threshold voltage states. The term "threshold voltage state" here denotes a state of a flash memory cell's threshold voltage that falls within a particular corresponding threshold voltage distribution. For example, FIGS. 1 and 2 illustrate various threshold voltage distributions defining threshold voltage states for single-bit flash memory cells and multi-bit flash memory cells. In particular, FIG. 1 shows different threshold voltage distributions for 1-bit, 2-bit, and 4-bit flash memory cells and FIG. 2 shows different threshold voltage distributions for 1.5-bit, 2.5-bit, and 3-bit flash memory cells.

Referring to FIG. 1, the one-bit flash memory cell stores data in relation to two distinct threshold voltage distributions, labeled "1" and "0". Where the one-bit flash memory cell has a threshold voltage state within the threshold voltage distribution labeled "1" (i.e., a threshold voltage state "1"), the one-bit flash memory cell stores a logical "1". Otherwise, where the one-bit flash memory cell has a threshold voltage state within the threshold voltage distribution labeled "0" (i.e., a threshold voltage state "0"), the one-bit flash memory cell stores a logical "0".

Similarly, the two-bit memory cell can store "11", "10", "00", and "01" by assuming different threshold voltage states within respective threshold voltage distributions labeled "11", "10", "00", and "01". Likewise, the 4-bit, 1.5-bit, 2.5-bit, and 3-bit memory cells can store data in relation to the threshold voltage distributions illustrated in FIGS. 1 and 2.

As can be seen in FIGS. 1 and 2, adjacent threshold voltage distributions tend to be separated by smaller margins as the number of threshold voltage distributions increases. As a result, flash memory cells designed to store more bits tend to be more susceptible to programming and sensing errors. For example, if leakage current occurs in the floating gate of a flash memory cell having small margins between adjacent threshold voltage distributions, it is more likely that a corresponding shift in the threshold voltage of the memory cell will cause a change in the threshold voltage state of the memory cell.

Moreover, as variation occurs in processing conditions for forming the multi-bit cells, in voltage levels of selected word lines, in the operating voltage of the multi-bit cells, or the temperature of the multi-bit cells, it becomes more likely that sensing or programming errors will occur due to the small inter-threshold voltage distributions of multi-bit cells. Because of the relatively lower reliability of multi-bit flash memory cells, single-bit flash memory devices remain more popular than multi-bit flash memory devices.

However, as flash memory devices continue to proliferate, some system designers have found it advantageous to create system components where multi-bit and single-bit flash memory devices can be used interchangeably. For instance, it may be useful to design page buffer circuits capable of programming or reading data in single-bit flash devices or multi-bit flash devices. Historically, most page buffer circuits had been developed to function exclusively with single-bit or multi-bit flash memory devices. However, some contemporary devices are designed to have more flexibility.

For example, recently, composite type flash memory devices have been developed. The composite type flash memory devices comprise single and multi-bit memory cells or multi-bit memory cells capable of storing different numbers of bits. As an example, some devices have been developed to operate in different modes where memory cells are used to store different numbers of bits. For example, a multi-bit flash memory device may be operated in a single-bit mode where each memory cell stores one bit of data or in a multi-bit mode where each memory cell stores more than one bit of data. The mode of the multi-bit flash memory device can be changed, for example in accordance with states of one or more fuses.

Unfortunately, page buffer technology for flash memory devices has not evolved to keep pace with the requirements of composite or multi-mode flash memory devices. As a result, multiple different types of page buffers may have to be used in composite type flash memory devices or different page buffers may have to be used depending on the mode of the multi-mode flash memory device. Unfortunately, this requirement for multiple page buffers tends to increase the chip size of flash memory devices.

SUMMARY OF THE INVENTION

According to an embodiment of the present invention, a flash memory device comprises a memory cell array, a page buffer circuit, and a control logic unit. The memory cell array comprises first type memory cells capable of storing m-bit data and second type memory cells capable of storing n-bit data, where n is not equal to m. The page buffer circuit comprises a plurality of page buffers adapted to operate in programming, erasing, and reading operations of the first and second type memory cells. The control logic unit adapted to determine respective functions performed by the page buffers based on whether each page buffer is associated with first type memory cells or second type memory cells. Each page buffer comprises a plurality of latches adapted to store data for different purposes during programming and reading operations depending on the data storage capacities of corresponding memory cells among the first and second type memory cells.

BRIEF DESCRIPTION OF THE DRAWINGS

Embodiments of the invention are described below in relation to the accompanying drawings. Throughout the drawings like reference numbers indicate like exemplary elements, components, and steps. In the drawings:

FIG. 4 shows an exemplary organization of memory cells constituting a NAND string shown in FIG. 3;

FIG. 10 illustrates functions associated with first and second latches included in page buffer PB shown in FIGS. 7 through 9;

FIG. 17 illustrates functions associated with first through third latches included in page buffer PB' shown in FIGS. 14 through 16;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Data retention characteristics of memory cells included in flash memory devices according to selected embodiments of the invention can be established in various patterns according to user requirements. As an example, the data retention characteristics may be established by setting a state(s) of fuse(s) or by storing data in one or more registers. A control logic unit may then operate to control functions carried out by latches in page buffers of a page buffer circuit according to the data retention characteristics indicated by the state(s) of the fuse(s) or register(s). Thus, the device is able to conduct programming, reading, and erasing operations in selected memory cells without changing structures of the page buffers, even when the number of bits stored in each memory cell varies.

Figure 1:
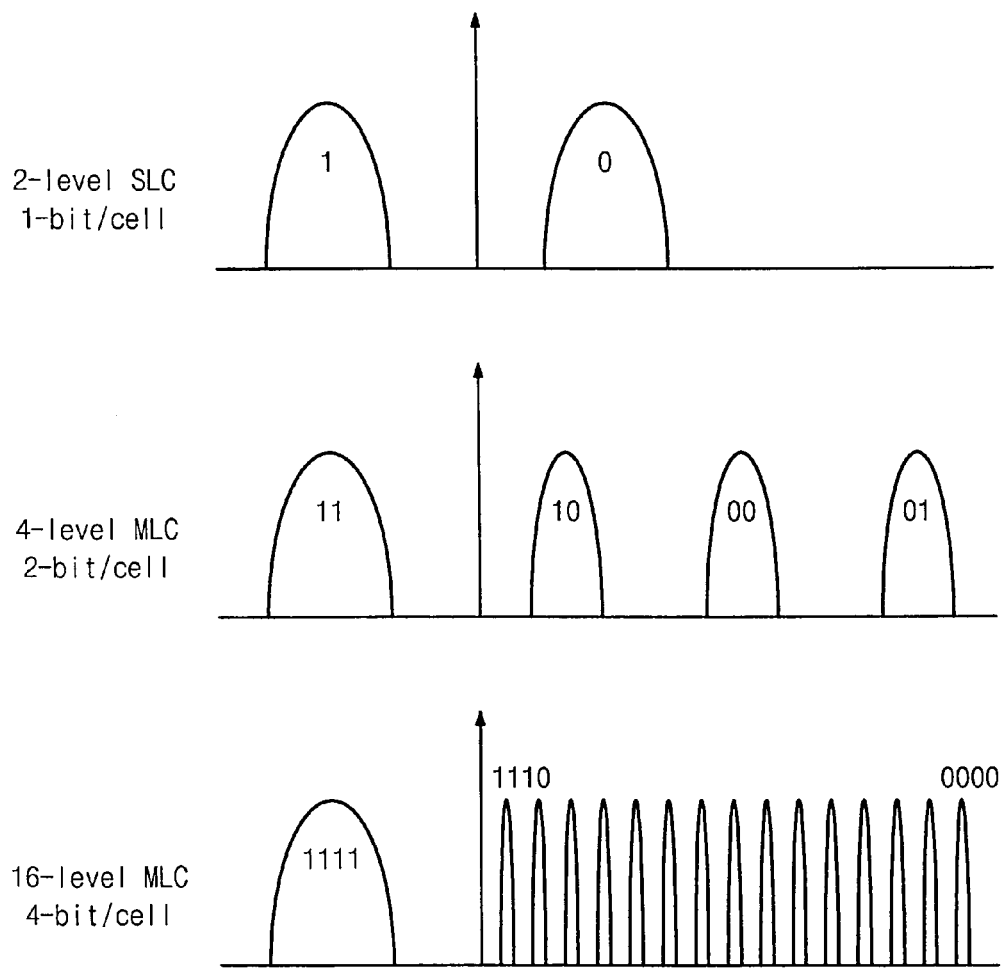
FIGS. 1 and 2 are graphs illustrating threshold voltage distributions of flash memory cells.
Figure 2:
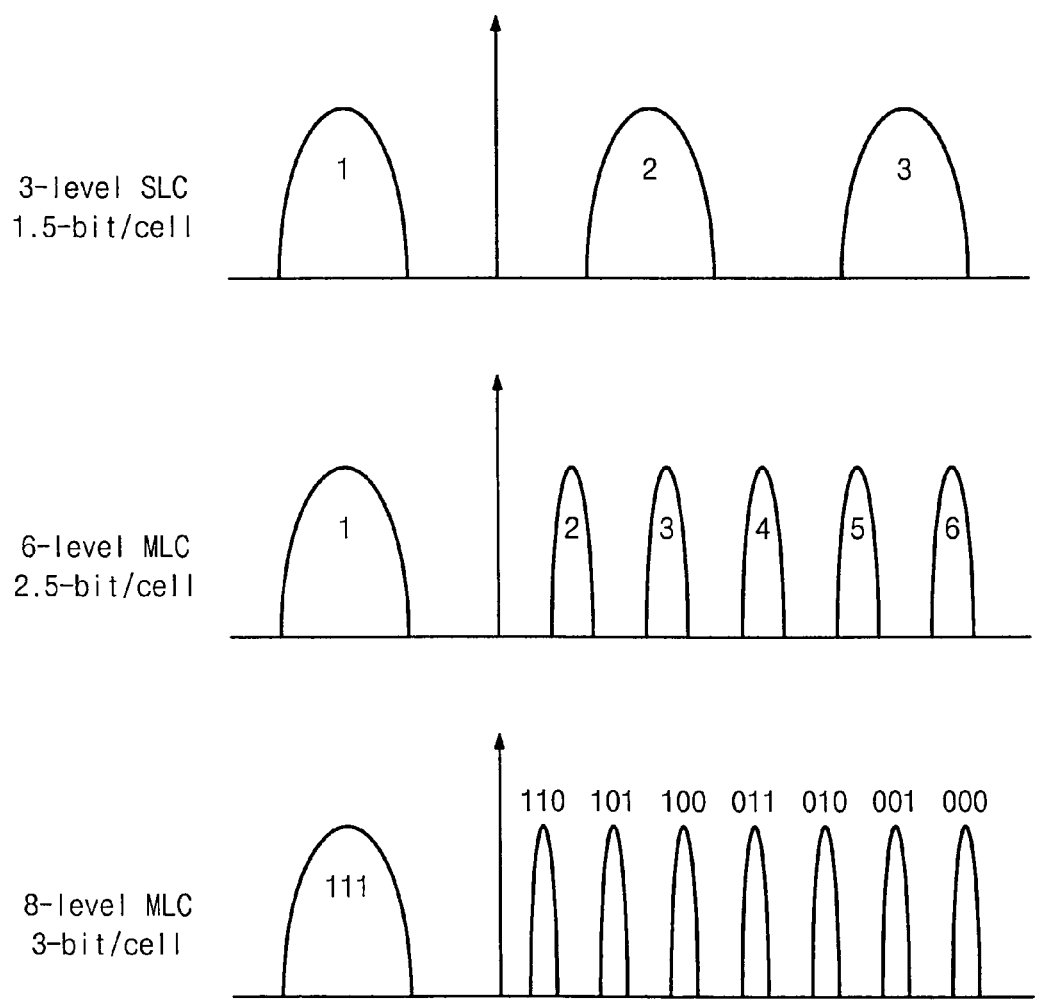
Figure 3:
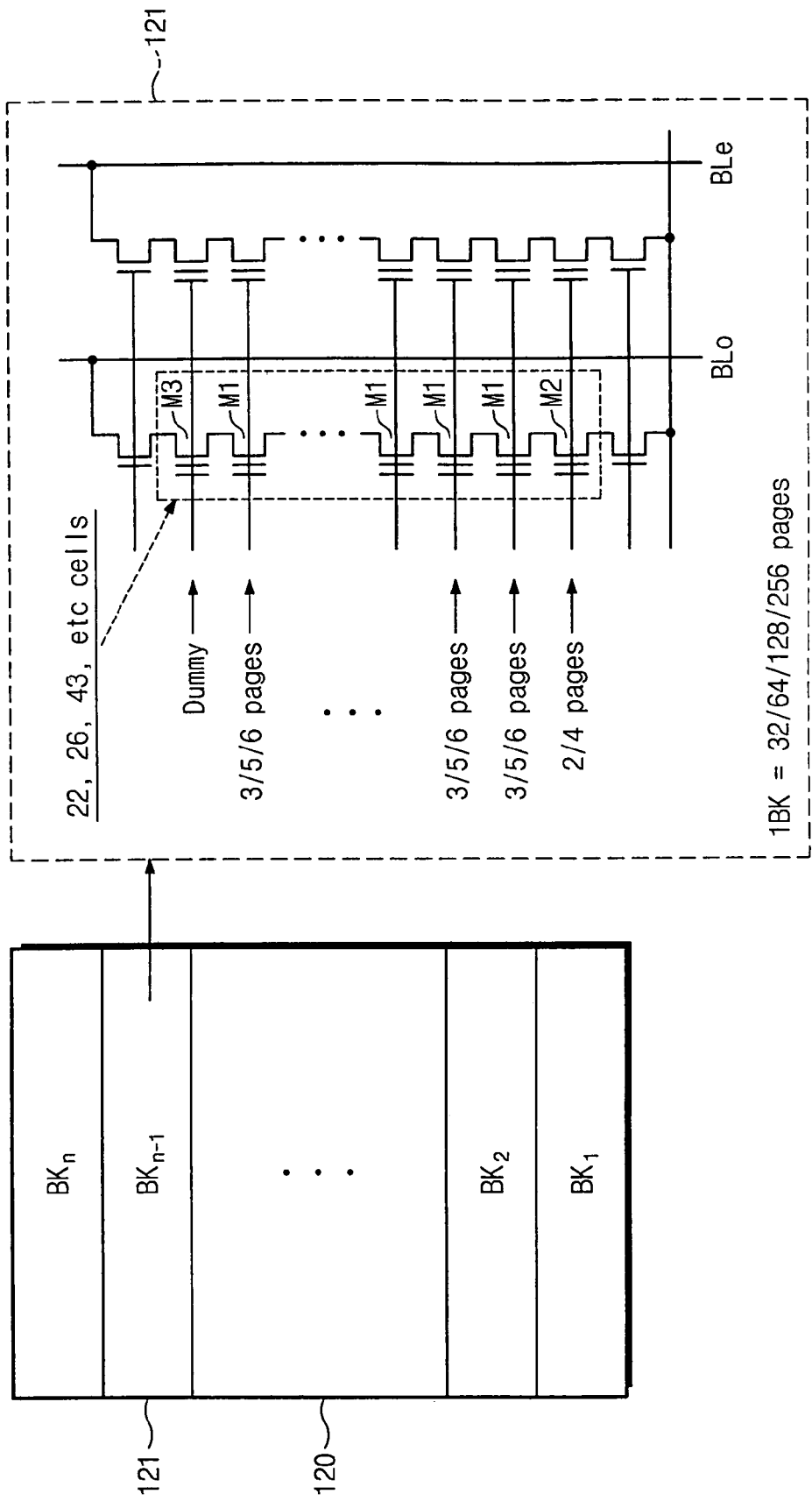
FIG. 3 is a block diagram illustrating a structure of a memory cell array of a flash memory device according to an embodiment of the invention.

FIG. 3 is a block diagram illustrating a structure of a memory cell array 120 of a flash memory device according to an embodiment of the invention, and FIG. 4 shows an exemplary organization of memory cells constituting a NAND string shown in FIG. 3. FIGS. 3 and 4 exemplarily show structural features of a multi-bit NAND flash memory device including at least two kinds of memory cells (i.e., memory cells storing different numbers of bits). However, the NAND flash memory device is described as a teaching example. In other words, various aspects of the invention may be embodied by different types of flash memories such as, e.g., NOR multi-bit flash memory devices.

Referring to FIGS. 3 and 4, memory cell array 120 comprises a plurality of memory blocks BK1 through BKn. Each block comprises 32, 64, 128, or 256 pages, each storing 512 bytes of data.

FIG. 3 illustrates the structure of a block 121 among blocks BK1 through BKn in further detail. Each of blocks BK1 through BKn is similar to block 121. Each NAND string includes some number of memory cells, e.g., 22, 23, 24, 43, 44, 45, 52, etc. The memory cells included in each NAND string may have different types from each other according to the number of bits that can be stored. For example, memory cells labeled M1, M2, and M3 may store different numbers of bits from each other. A NAND string comprising memory cells capable of storing different numbers of bits will be referred hereafter as composite NAND strings. Similarly, a memory cell array such as memory cell array 120 formed of composite NAND strings will be referred to as a composite memory cell array.

In NAND flash memory devices, programming and reading operations are typically carried out in page units, but erase operations are performed in block units comprising multiple pages. Accordingly, the number of pages in each block is regarded as being so important in regulating operations of the flash memory device. Nowadays most manufacturers of flash memory devices produce the flash memory products on basis of the case that a unit memory cell stores $2^n$ bits. Accordingly, product specifications for flash memory devices and control schemes of file systems are commonly defined with reference to memory cells storing $2^n$ bits. As a result, it may be possible to use conventional control schemes without modification where the number of pages in each block is $2^n$ for some integer value of n. Accordingly, even where a NAND string has a variable number of bits per cell, it may be desirable for each block to contain $2^n$ pages in order to conform with conventional control schemes and so on. For this reason, the NAND string shown in FIG. 3 is constructed by adjusting the number of memory cells and bits per cell so that the number of pages in the corresponding block is equal to $2^n$ for some integer value of n. In this case, the number of memory cells in each NAND string does not necessarily have to be equal to $2^n$ for some integer value of n in order for the total number of pages per block to be equal to $2^n$.

In the composite NAND string shown in FIG. 3, the memory cells labeled M1 each store some number of bits not equal to $2^n$ for some integer value of n. For example, these memory cells may store 1.5, 2.5, or 3 bits of data. The memory cells labeled M1 will be referred to as first-type memory cells. The memory cell labeled M2 each store $2^n$ bits of data for some integer value of n and will be referred to as second-type memory cells. For example, the second-type memory cells may store 1 or 2 bits of data. The memory cell labeled M3 is a dummy cell that does not store data and is referred to as a third-type memory cell. In the composite NAND string, most memory cells are first-type memory cells M1 and remaining memory cells are second or third-type memory cells M2 or M3. The second or third-type memory cells M2 or M3, may be arranged in positions with weak programming characteristics.

For instance, as illustrated in FIG. 4, where one block comprises 64 pages and one composite NAND string comprises 22 memory cells, 20 memory cells may be first-type memory cells M1 each storing 1.5-bit data and each of the remaining two memory cells may be second-type memory cells M2 storing 1-bit data. In this case, second-type memory cells M2 may be disposed on upper and lower word lines connected to the NAND string, where programming characteristics may be relatively unstable compared with programming characteristics of other memory cells in the NAND string.

In designing flash memory devices, developers tend to vary the number of bits per cell in accordance with the application in which the flash memory devices are used. For example, in applications requiring a relatively high degree of accuracy, designers typically use fewer bits per cell (e.g., 1 or 1.5 bits). On the other hand, where relatively less accuracy is required, memory cells storing more bits (e.g., 2 or 3 bits) may be used.

As will be described hereinafter, flash memory devices according to various embodiments of the present invention conduct programming, reading, and erasing operations without altering or modifying a structure of the page buffer even if the number of bits stored in each memory cell is varied. In such flash memory devices, the number of bits per cell, string, page, and block can be varied.

Figure 5:
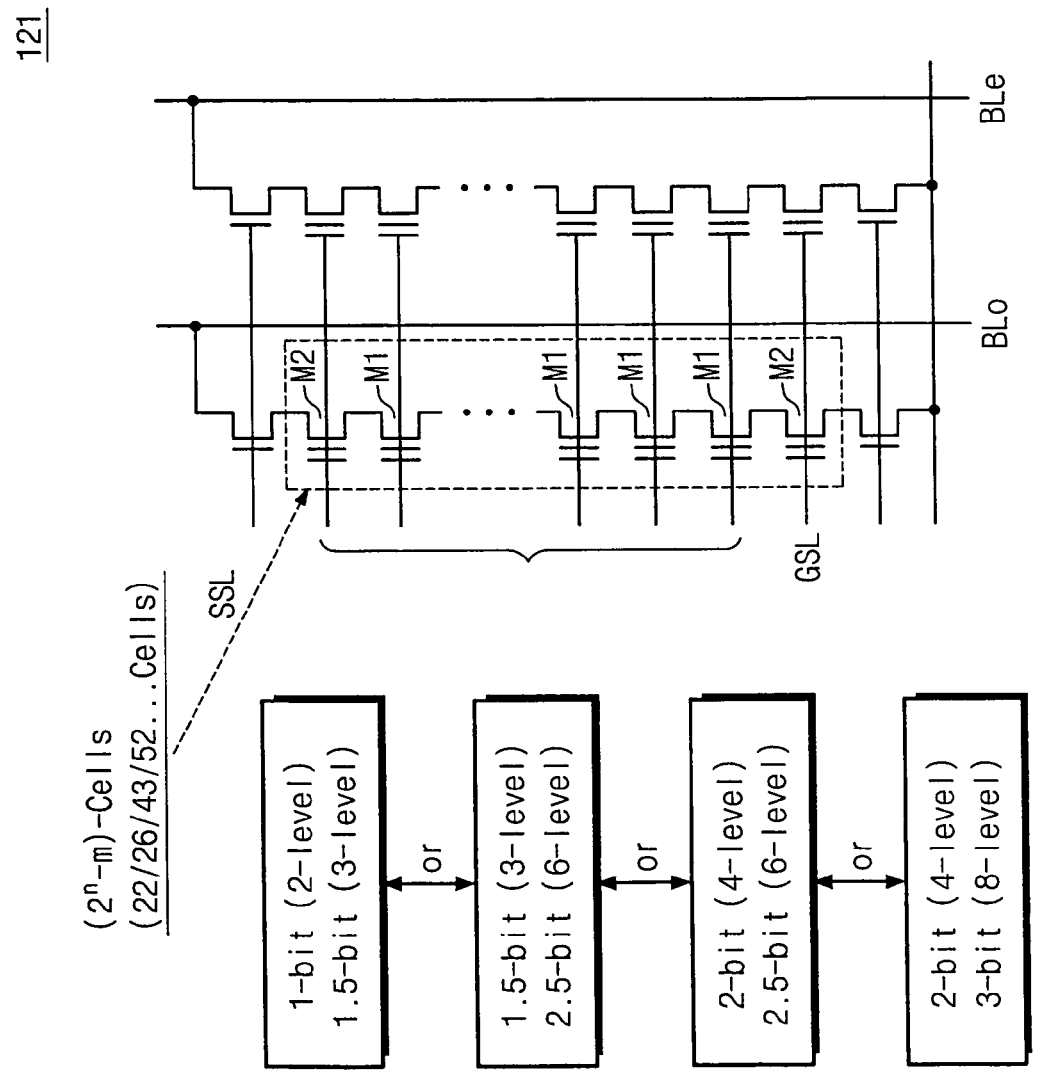
FIGS. 5 and 6 illustrate an example of memory cell storage capacity variation in a flash memory device according to an embodiment of the invention.
Figure 6:
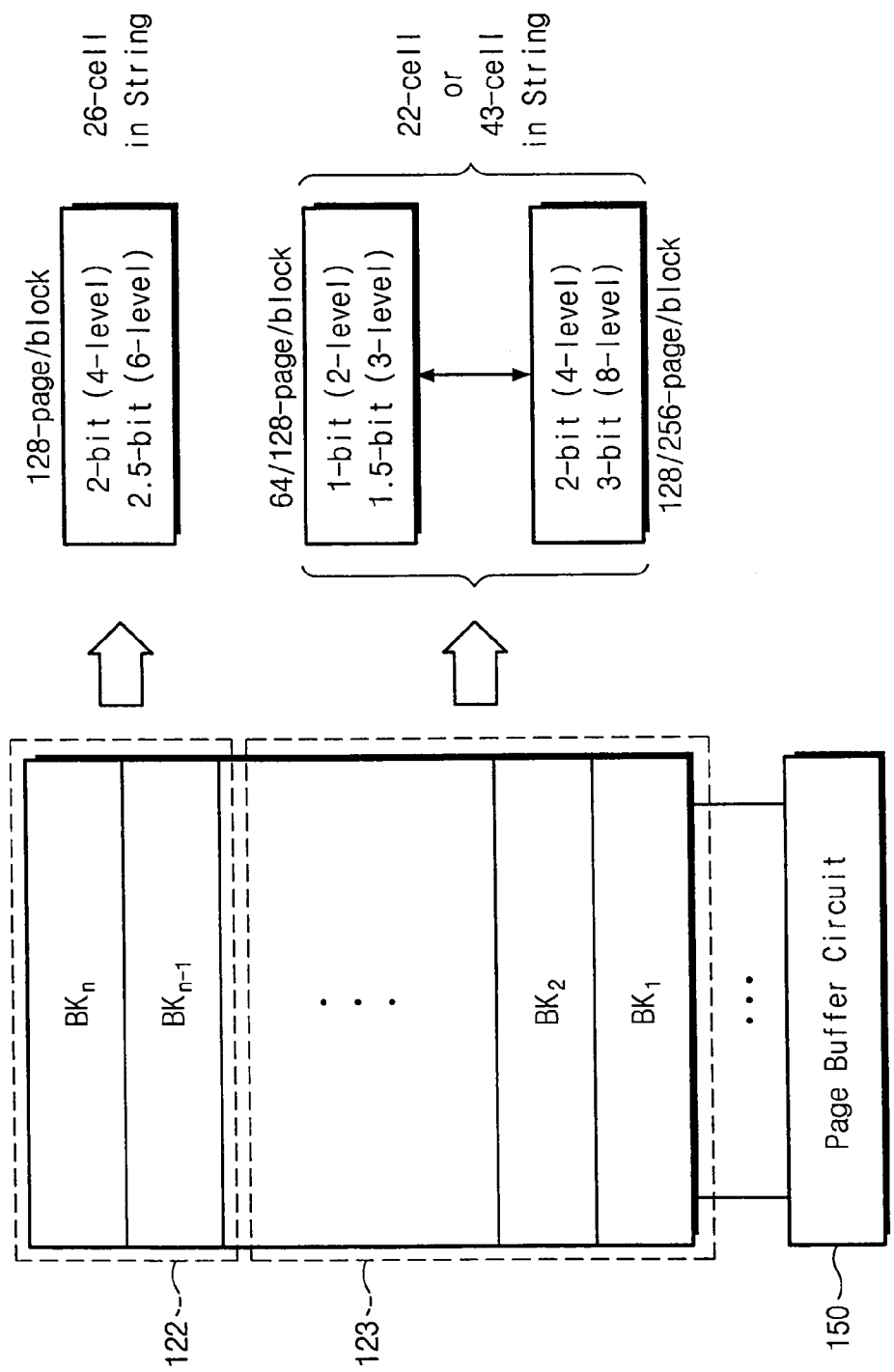

FIGS. 5 and 6 illustrate an example of memory cell storage capacity variation in a flash memory device according to an embodiment of the invention. In particular, the example of FIGS. 5 and 6 is presented in relation to block 121.

Referring to FIGS. 5 and 6, each composite NAND string comprises at least two types of memory cells (i.e., memory cells capable of storing different numbers of bits). The number of bits stored in each memory cell can be varied, for example, in accordance with states of one or more fuses or data stored in one or more registers. For instance, the composite NAND string may be composed of memory cells each storing 1-bit data (i.e., 2-level SLC), and memory cells each storing 1.5-bit data (i.e., 3-level SLC). In the composite NAND string, the memory cells each storing 1 bit (i.e., 2 levels) may be modified (or converted) to store 1.5 bits (3 levels) or 2 bits (4 levels). Similarly, the memory cells each storing 1.5 bits (i.e., 3 levels) may be modified to store 2.5 bits (6 levels) or 3 bits (8 levels). The conversion between different numbers of bits per memory cell (e.g., in relation to fuse or register state(s)) can be controlled, for example, using a control logic unit 190 shown in FIG. 7.

Such a conversion may be performed on a single block such as block 121 or on multiple blocks such as the units 122 and 123 shown in FIG. 6. The number and composition ratio of the memory cells included in the composite NAND string of each block may be varied on an individual block basis or on the basis of multiple memory blocks (e.g., units 122 and 123). Along with the constitutional differences among the composite NAND strings in memory blocks BK1 through BKn, the number of pages in different memory blocks may also be varied. However, in flash memory devices according to various embodiments of the invention, programming, reading, and erase operations may performed using a single page buffer circuit 150.

Figure 7:
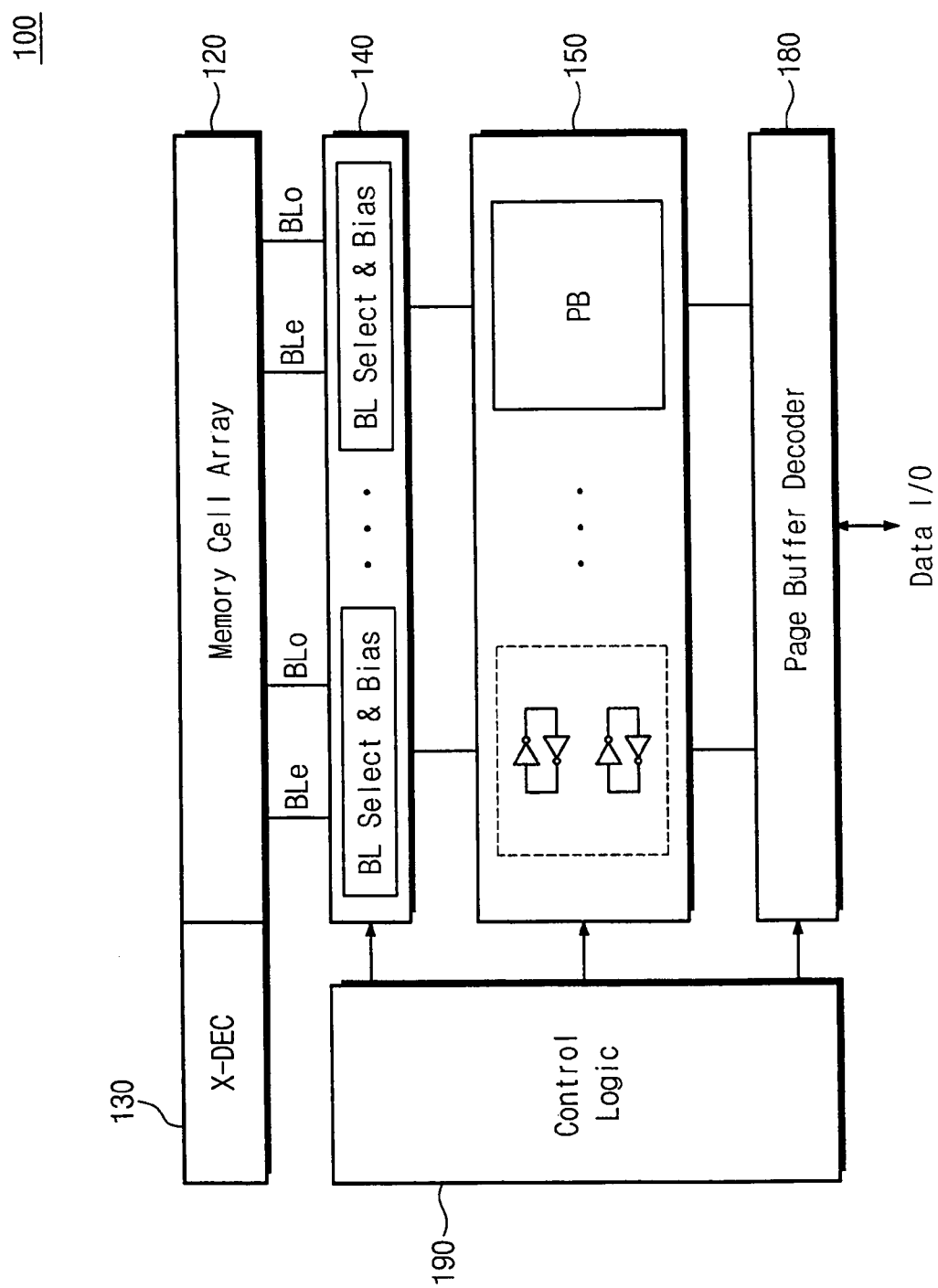
FIG. 7 is a block diagram illustrating an organization of a flash memory device according to an embodiment of the invention.

FIG. 7 is a block diagram illustrating an organization of a flash memory device 100 according to an embodiment of the invention. Referring to FIG. 7, flash memory device 100 is a multi-bit flash memory device including page buffer circuit 150 configured in a dual latch structure.

Referring to FIG. 7, flash memory device 100 comprises memory cell array 120, a row decoder (X-Dec) 130, a bit-line selection and bias circuit 140, page buffer circuit 150, a page buffer decoder 180, and control logic unit 190. Memory cell array 120 has the same structure as that shown in FIGS. 3 through 5.

Rows of memory cell array 120 are selected and driven by row decoder 130. Bit-line selection and bias circuit 140 is controlled by control logic unit 190 to select a subset of the bit lines of memory cell array 120. Bit lines selected by bit-line selection and bias circuit 140 are electrically connected to page buffer circuit 150.

Page buffer circuit 150 is regulated by control logic unit 190, functioning as a program driver or a sense amplifier according to an operation mode. For instance, page buffer circuit 150 acts as a sense amplifier during a reading operation and as a program driver during a programming operation. Page buffer circuit 150 comprises a plurality of page buffers PB respectively corresponding to bit lines or bit line pairs. Each page buffer PB comprises two latches. As will be described hereinafter, page buffers PB can be used to perform programming, reading, and erase operations even when the number of memory cells, bits per memory cell, or pages within a memory block are varied.

For instance, page buffer circuit 150 can be used to store data in a memory block capable of storing some number of bits not equal to $2^n$, for any integer value of n. Accordingly, the latches included in each page buffer PB are defined each with their own functions (e.g., storing data which has been previously programmed, storing data currently being programmed, storing data to be programmed subsequently, and so on) in accordance with the number of bits that can be stored in the memory cells. These functions of the latches can be determined by control logic unit 190, e.g., in accordance with state(s) of one or more fuses or data stored in one or more registers. The functions carried out each of page buffers PB will be explained below in further detail with reference to FIG. 10.

Figure 8:
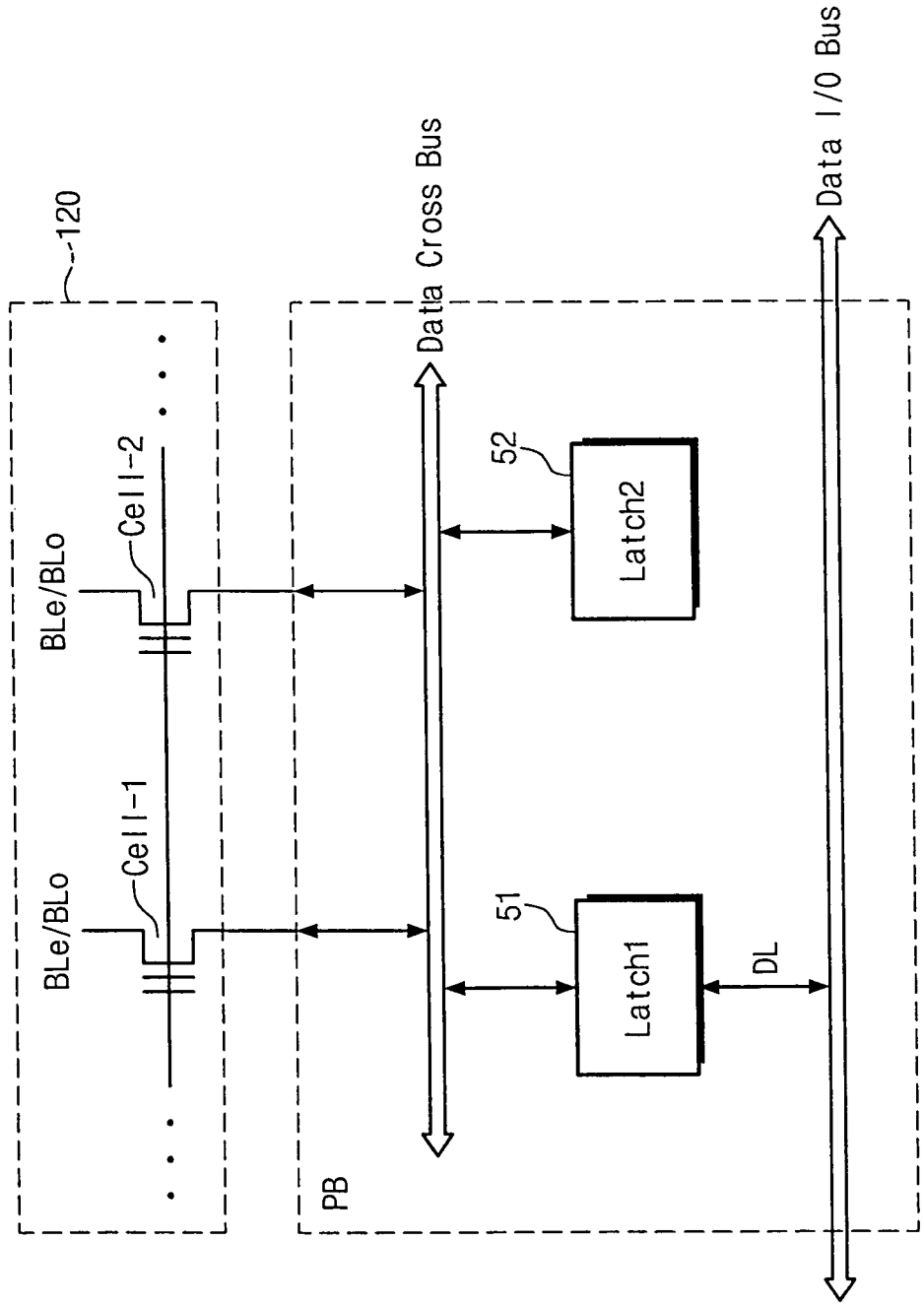
FIG. 8 is a block diagram illustrating a schematic structure of a page buffer PB shown in FIG. 7.
Figure 9:
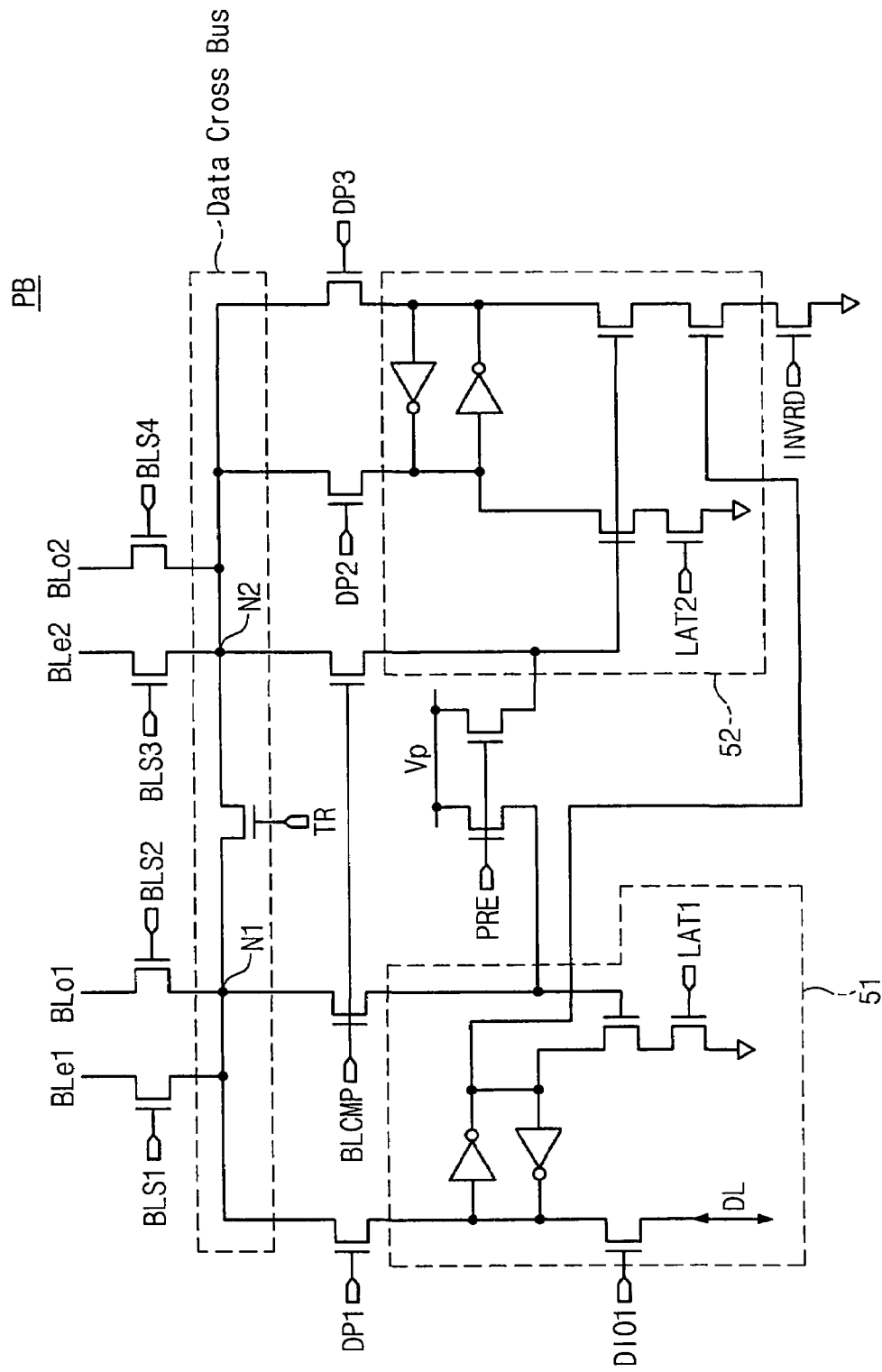
FIG. 9 is a circuit diagram illustrating a detailed structure of page buffer PB shown in FIG. 7.

FIG. 8 is a block diagram illustrating a schematic structure of page buffer PB shown in FIG. 7, and FIG. 9 is a circuit diagram illustrating a detailed structure of page buffer PB shown in FIG. 7.

Referring to FIGS. 8 and 9, page buffer PB comprises two latches, i.e., first and second latches 51 and 52. First and second latches 51 and 52 are selectively connected to a data cross bus through first and second nodes N1 and N2, respectively. The number of latches connected to the data cross bus can be adjusted under the control of control logic unit 190. The data cross bus is provided to conduct data interface operations between page buffer circuit 150 and bit lines, or in other words, between page buffer circuit 150 and bit-line selection and bias circuit 140. Bit-line selection and bias circuit 140 operates to selectively connect the data cross bus with a bit line pair BLe1 and BLo1 coupled to a first memory cell Cell-1, and a bit line pair BLe2 and BLo2 coupled to a second memory cell Cell-2. Meanwhile, first latch 51 is connected to a data IO bus through a data line DL. The data IO bus provides a data interface between page buffer circuit 150 and an external system (or host).

FIG. 10 illustrates functions associated with first and second latches 51 and 52 included in page buffer PB shown in FIGS. 7 through 9.

Referring to FIG. 10, the number of bits stored in corresponding memory cells determines the functions of first and second latches 51 and 52. First and second latches 51 and 52 may be connected to bit line pairs BLe1/BLo1 and BLe2/BLo2 corresponding to both of first and second memory cells Cell-1 and Cell-2, or connected to bit line pairs BLe1/BLo1 or BLe2/BLo2 corresponding to one of first and second memory cells Cell-1 and Cell-2. Interconnections between first and second latches 51 and 52 and functions carried out by first and second latches 51 and 52 are determined by control logic unit 190 in accordance with the number of bits stored in the corresponding memory cells (e.g., as indicated by a state of a fuse or a register).

As an example, where each of memory cells Cell-1 and Cell-2 stores 1-bit data (i.e., in relation to 2 threshold voltage distributions), first latch 51 is used to conduct a programming or reading operation for one of first and second memory cells Cell-1 and Cell-2 while second latch 52 is used as a cache for storing data to be programmed next. Data held by first latch 51 is programmed through its corresponding bit line (i.e., an even or odd bit line connected to one of first and second memory cells Cell-1 and Cell-2). The programmed data is read out through first latch 51. On the other hand, where each of memory cells Cell-1 and Cell-2 store 1.5-bit data, i.e., where the two memory cells collectively store 3-bit data, first latch 51 is used to conduct a programming or reading operation for first memory cell Cell-1, while second latch 52 is used to conduct a programming or reading operation for second memory cell Cell-2. Memory cells storing 1-bit or 1.5-bit data will be referred to as single-bit memory cells.

Functions of the latches will now be described for cases where the corresponding memory cells store 2-bit data (i.e., in relation to 4 threshold voltage distributions), 2.5-bit data (i.e., in relation to 6 threshold voltage distributions), or 3-bit data (i.e., in relation to 8 threshold voltage distributions). First latch 51 is used for programming or reading one of first and second memory cells Cell-1 and Cell-2, while second latch 52 is used for reading data that has been programmed just before a programming operation conducted by first latch 51, from first or second memory cell Cell-1 or Cell-2.

A multi-bit programming operation is generally composed of multiple programming steps or cycles. Each programming step is carried out in conjunction with a previously programmed result and data to be programmed at present. Once the previously programmed result is read by second latch 52, program data (i.e., data to be programmed at present) loaded in first latch 51 is written into its corresponding memory cell. Memory cells storing 2, 2.5, or 3 bits will be referred to as multi-bit memory cells. The functions of first and second latches 51 and 52 where the corresponding unit memory cells each store 2-bit data are also applicable where the corresponding unit memory cells store more bits, e.g., 4, 8, or 16-bit data.

A programming operation performed using page buffer circuit 150 will now be described. As described above, the functions of latches in each page buffer PB in page buffer circuit 150 will vary according to the number of bits stored in the corresponding memory cell.

Figure 11:
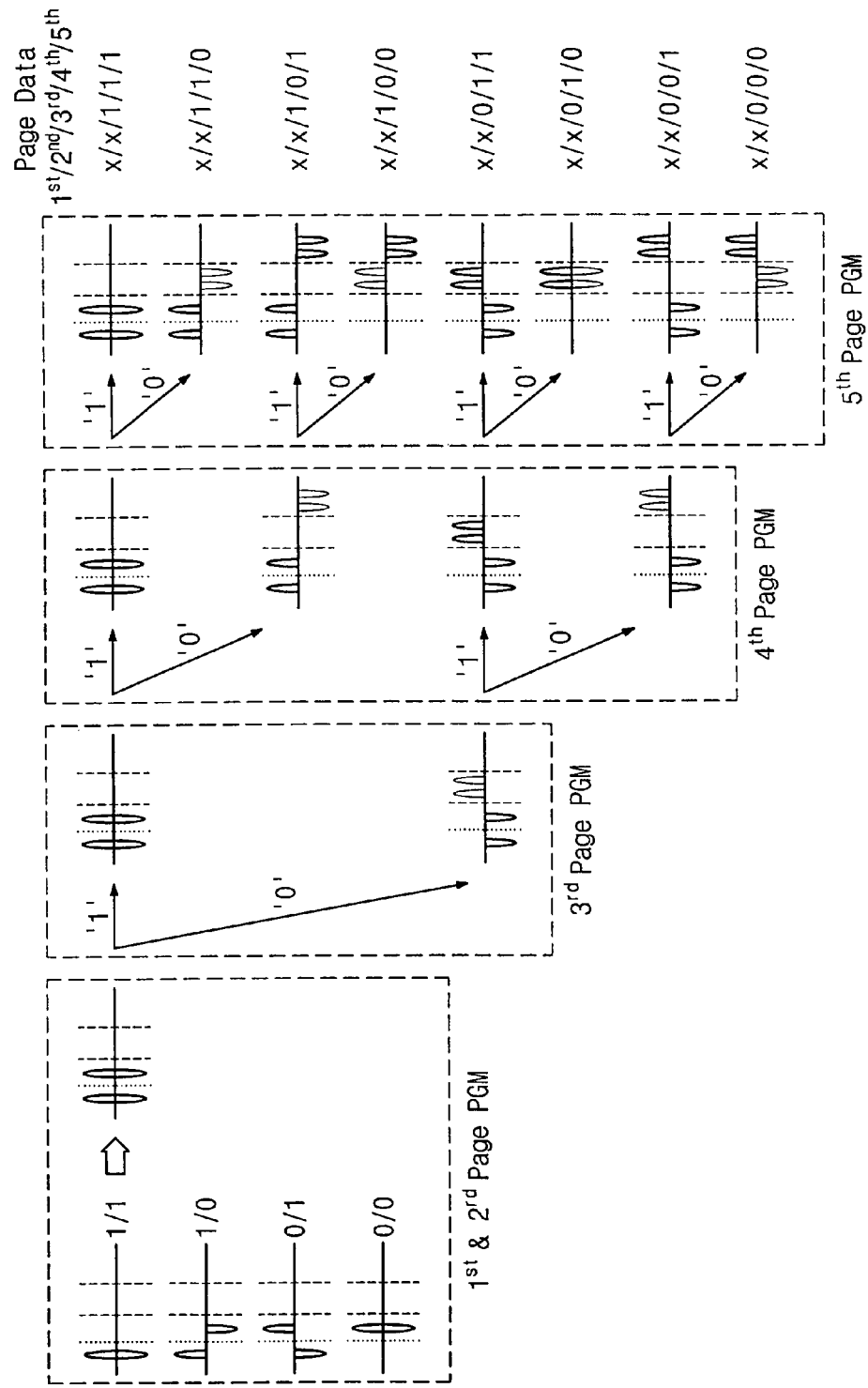
FIG. 11 shows threshold voltage distribution profiles of a flash memory cell storing 2.5 bits of data, or a pair of memory cells cumulatively storing 5-bits of data.

FIG. 11 illustrates threshold voltage distributions of flash memory cells capable of storing 2.5-bit data (i.e., in relation to 6 threshold voltage distributions). A pair of such flash memory cells can be used to store 5-bit data. FIG. 11 exemplarily illustrates threshold voltage distributions in different programming steps for a data state of 1/1 among data states 1/1, 1/0, 0/1, and 0/0 which are initially settable by two memory cells. With reference to FIGS. 10 and 11, now will be described operations of the page buffer while programming 2.5-bit data (i.e., 6 levels) into a unit memory cell.

Figure 12:
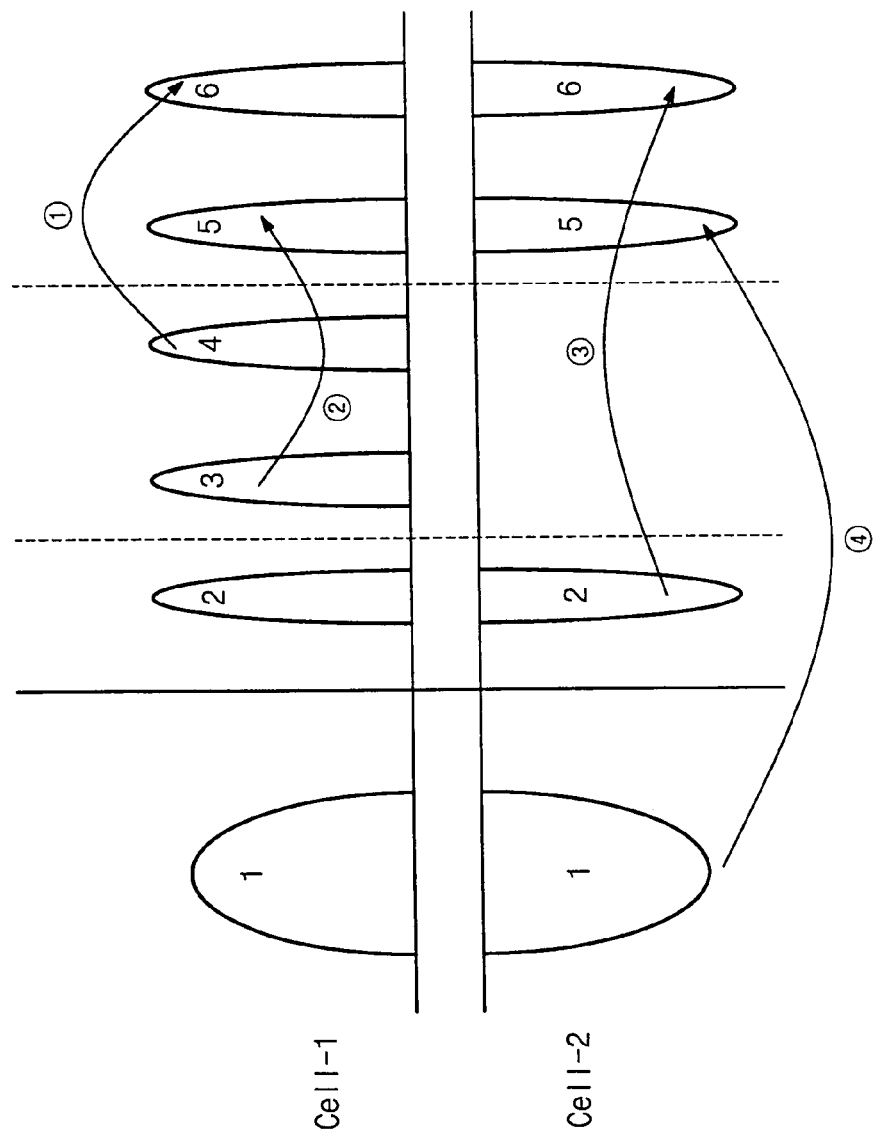
FIG. 12 shows variations of threshold voltages corresponding to a fourth stage of a 6-level MLC programming operation in the flash memory device shown in FIG. 7.
Figure 13:
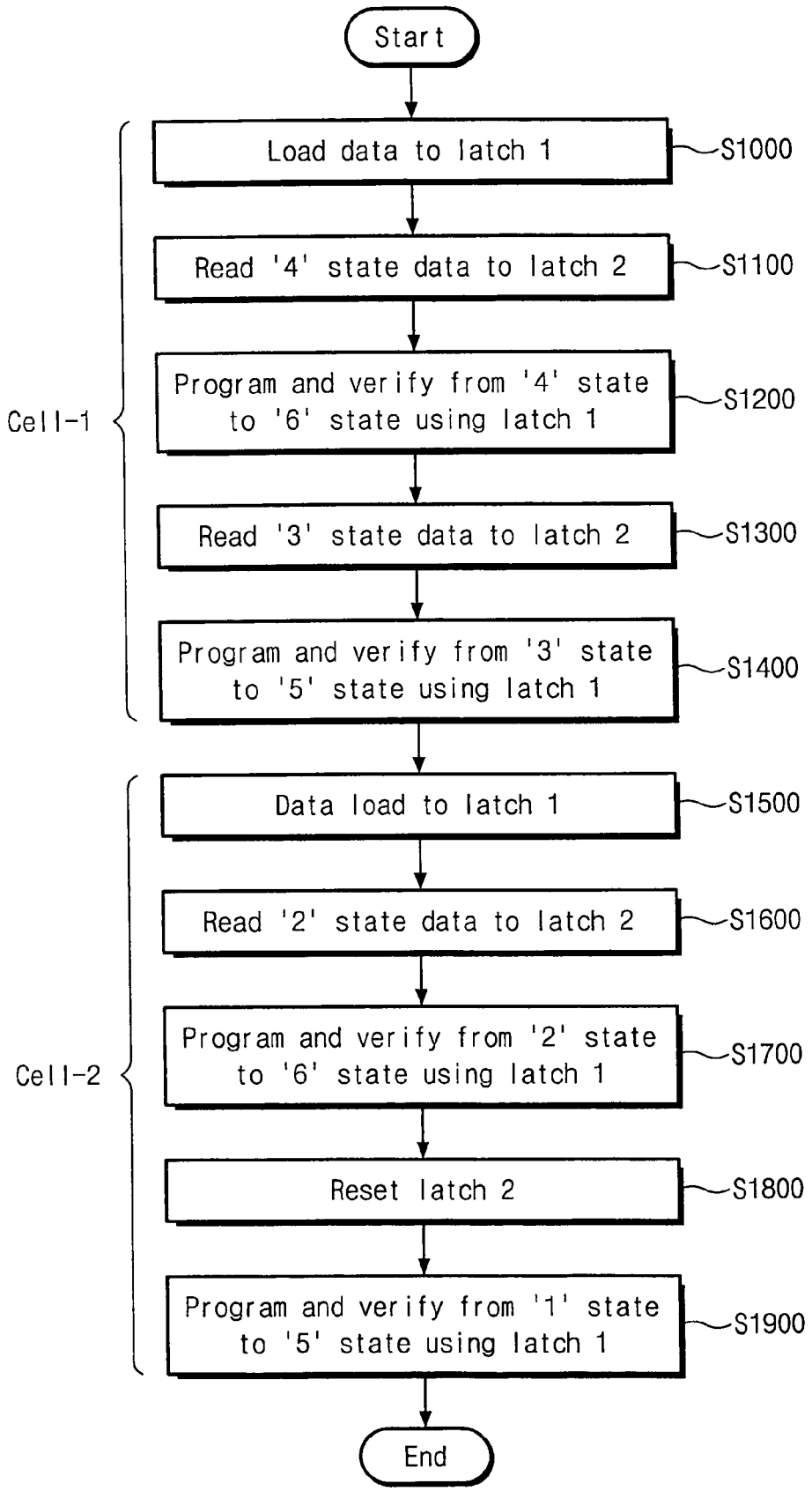
FIG. 13 is a flow chart showing the fourth stage of the 6-level MLC programming operation in the flash memory device shown in FIG. 7.

FIG. 12 shows variations of threshold voltages corresponding to a fourth stage of a 6-level MLC programming operation in the flash memory device shown in FIG. 7, and FIG. 13 is a flow chart showing the fourth stage of the 6-level MLC programming operation. FIGS. 12 and 13 illustrate the 6-level MLC programming operation carried out by page buffer circuit 150 with the dual latch structure. The 6-level MLC programming operation is conducted to store 2.5-bit data in a memory cell, and to store 5-bit data in a pair of memory cells. Therefore, FIGS. 12 and 13 illustrate variations of threshold voltages and programming features in two memory cells, e.g., first and second memory cells Cell-1 and Cell-2.

Referring to FIG. 12, the fourth stage of the 6-level MLC programming operation comprises four programming steps. In a first step, a threshold voltage of first memory cell Cell-1, which is conditioned in data state '4', moves to data state '6' (see, arrow labeled '1'). In a second step, a threshold voltage of first memory cell Cell-1, which is conditioned in data state '3', moves to data state '5' (see, arrow labeled '2'). In a third step, a threshold voltage of second memory cell Cell-2, which is conditioned in data state '2', moves to data state '6' (see, arrow labeled '3'). In a fourth step, a threshold voltage of second memory cell Cell-2, which is conditioned in data state '1', moves to data state '5' (see, arrow labeled '4').

As illustrated in FIGS. 8 and 9, page buffer PB including two latches is connected with two memory cells Cell-1 and Cell-2. First and second latches 51 and 52 conduct programming and reading operations each for first and second memory cells Cell-1 and Cell-2. In executing the programming sequence shown in FIG. 12 by means of dual-latch page buffer circuit 150, four programming cycles and four program verifying cycles are required. As will be described later, the programming operation for first and second memory cells Cell-1 and Cell-2 can be accomplished through a shortened procedure with one programming cycle and four program-verifying cycles using a modified page buffer circuit (see, e.g., element 250 in FIG. 14) comprising three latches per page buffer (e.g., PB' of FIG. 14).

Referring to FIG. 13, first memory cell Cell-1 operates in first and second steps shown in FIG. 12. Second memory cell Cell-2 operates in third and fourth steps shown in FIG. 12. The programming operations for first and second memory cells Cell-1 and Cell-2 are carried out by a single page buffer PB including the two latches 51 and 52. Each page buffer PB used in the method of FIG. 13 is structured similar to that that illustrated in FIG. 8 or 9.

In the description that follows, exemplary method steps are denoted by parentheses (SXXXX) to distinguish them from exemplary features or elements.

In the method of FIG. 13, the first step illustrated in FIG. 12 begins programming first memory cell Cell-1 by loading program data into first latch 51 (S1000). Next, a data state '4' is read out from first memory cell Cell-1 through second latch 52 (S1100). Then, data state '4' is programmed into a data state '6' with reference to a result of reading the data state '4' in step S1100, and the result of programming data state '6' is verified (S1200). The programming and verifying operations of step S1200 are repeated by first latch 51 until data state '4' is successfully programmed to data state '6' in first memory cell Cell-1.

Subsequently, in executing the second step illustrated in FIG. 12 for programming first memory cell Cell-1, a data state '3' is read out from first memory cell Cell-1 through second latch 52 (S1300). Thereafter, data state '3' is programmed into a data state '5' with reference to data loaded in step S1000 and a result of reading data state '3' in step S1300, and a result of the programming is verified (S1400). The programming and verifying operations in S1400 are repeated by the first latch 51 until the data state '3' is successfully programmed to the data state '5' in the first memory cell Cell-1.

Next, in executing the third step illustrated in FIG. 12 for second memory cell Cell-2, program data is loaded into first latch 51 (S1500). Second latch 52 is typically initialized while first memory cell Cell-1 is programmed. Thereafter, a data state '2' is read out from second memory cell Cell-2 through second latch 52 (S1600). Next, data state '2' is programmed into data state '6' with reference to the data loaded in step S1500 and a result of reading data state '2' in step S1600, and verifies a result of programming (S1700). The programming and verifying operations of step S1700 are repeated by first latch 51 until data state '2' is successfully programmed to data state '6' in second memory cell Cell-2.

Next, in executing the fourth step illustrated in FIG. 12 for second memory cell Cell-2, second latch 52 is reset to be conditioned a state of program-inhibition (S1800). Accordingly, a data state '1' is programmed into data state '5' by first latch 51, and a result of programming is verified (S1900). The programming and verifying operations in S1900 are repeated by first latch 51 until data state '1' is successfully programmed to data state '5' in second memory cell Cell-2.

The functions of first and second latches 51 and 52 for conducting the first through fourth steps of the programming process of FIG. 12 are determined by control logic unit 190. The functions of latches 51 and 52 are determined by control logic unit 190 in accordance with a number of bits stored in corresponding memory cells (e.g., as indicated by a state of a fuse or data stored in a register). The number of bits per cell may or may not be a power of 2.

More particularly, the number of bits per cell defines the number of memory cells allocated to each NAND string and the number of pages allocated to each block. Whereas the number of memory cells allocated to the NAND string may be some number other than a power of two, the number of pages allocated to each block can be adjusted to be a power of two. Thus, it is possible to use the structure of page buffer circuit 150 in conventional flash memory devices without including additional circuits therein.

Flash memory device 100 may be configured such that different memory blocks have different numbers of pages. The number of pages in each memory block may be evaluated based on a state of one or more fuses or data stored in one or more registers. Accordingly, flash memory device 100 may operate by regulating functions of latches in page buffer circuit 150 in order to conduct programming or erase operations appropriate to the number of pages allocated to each page buffer PB. Hence, page buffer circuit 150 can be normally used to conduct programming and reading operations for various types of memory cells.

Figure 14:
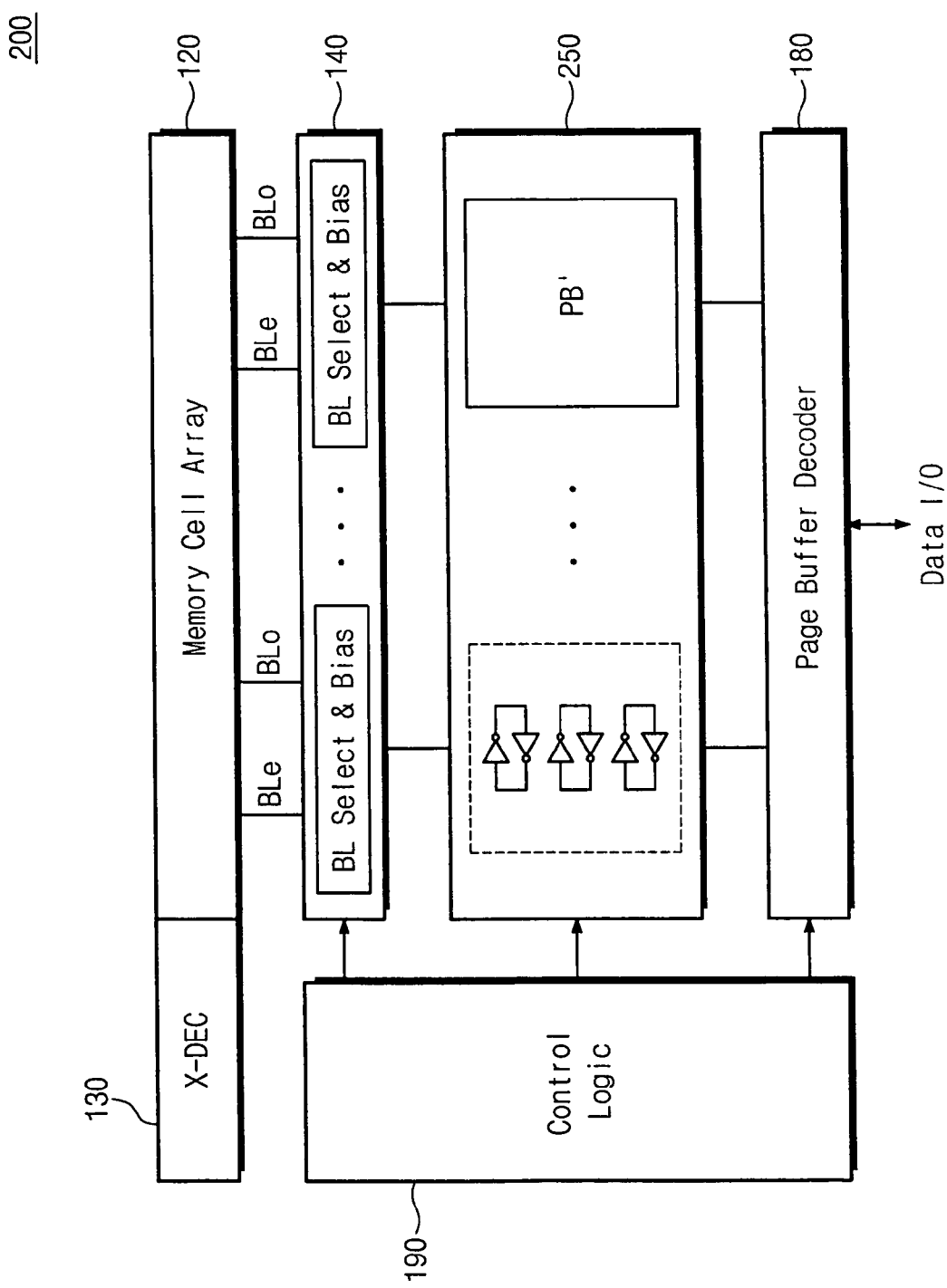
FIG. 14 is a block diagram illustrating an organization of a flash memory device according to another embodiment of the invention.

FIG. 14 is a block diagram illustrating an organization of a flash memory device 200 according to another embodiment of the invention. Flash memory device 200 is a multi-bit flash memory device comprising page buffer circuit 250 having a triple latch structure.

Referring to FIG. 7, flash memory device 200 is substantially same as page buffer circuit 100, except for the structure of page buffer circuit 250. Accordingly, the like reference numerals are used for like elements without further description to avoid redundancy.

Figure 15:
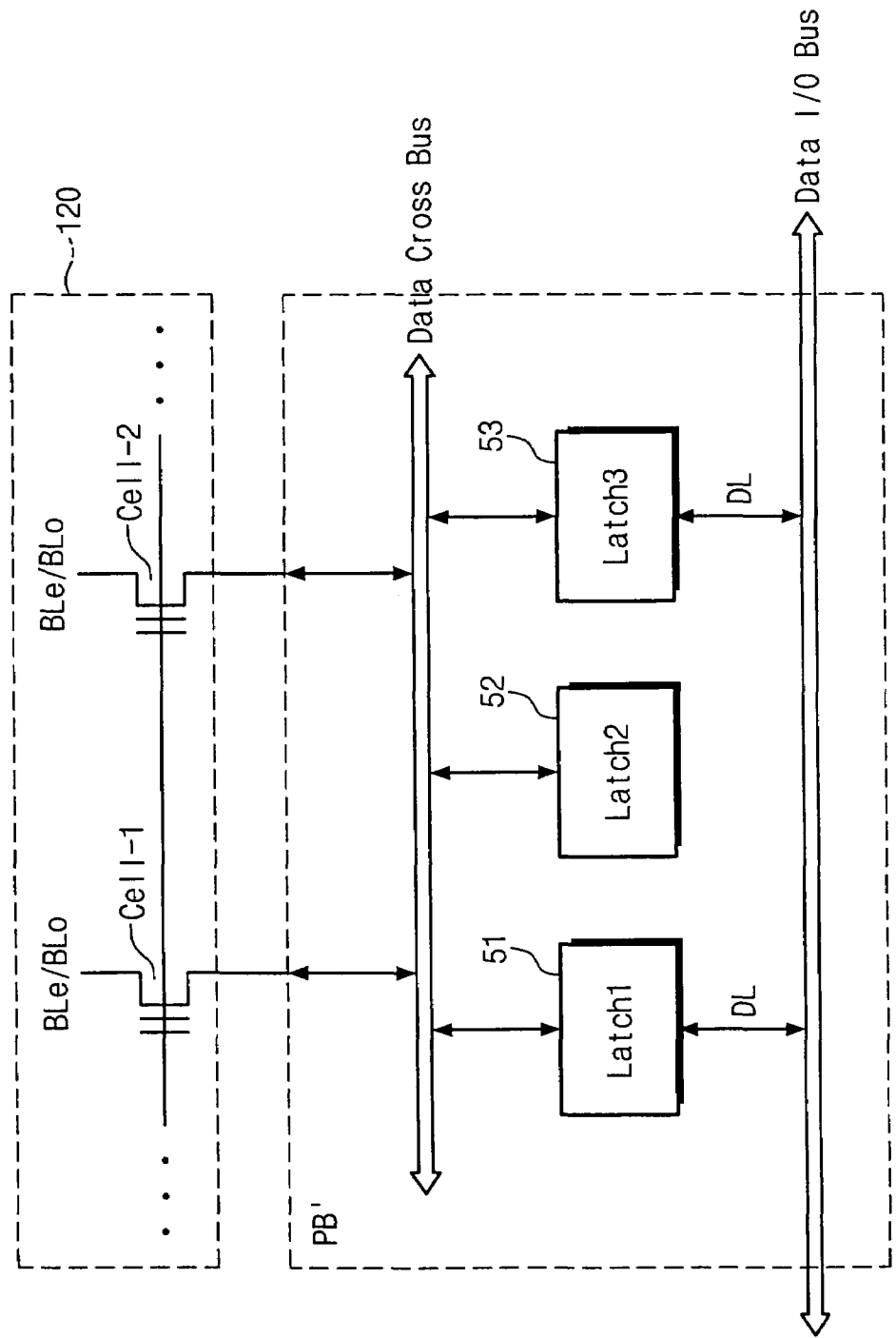
FIG. 15 is a block diagram illustrating a schematic structure of a page buffer PB' shown in FIG. 14.
Figure 16:
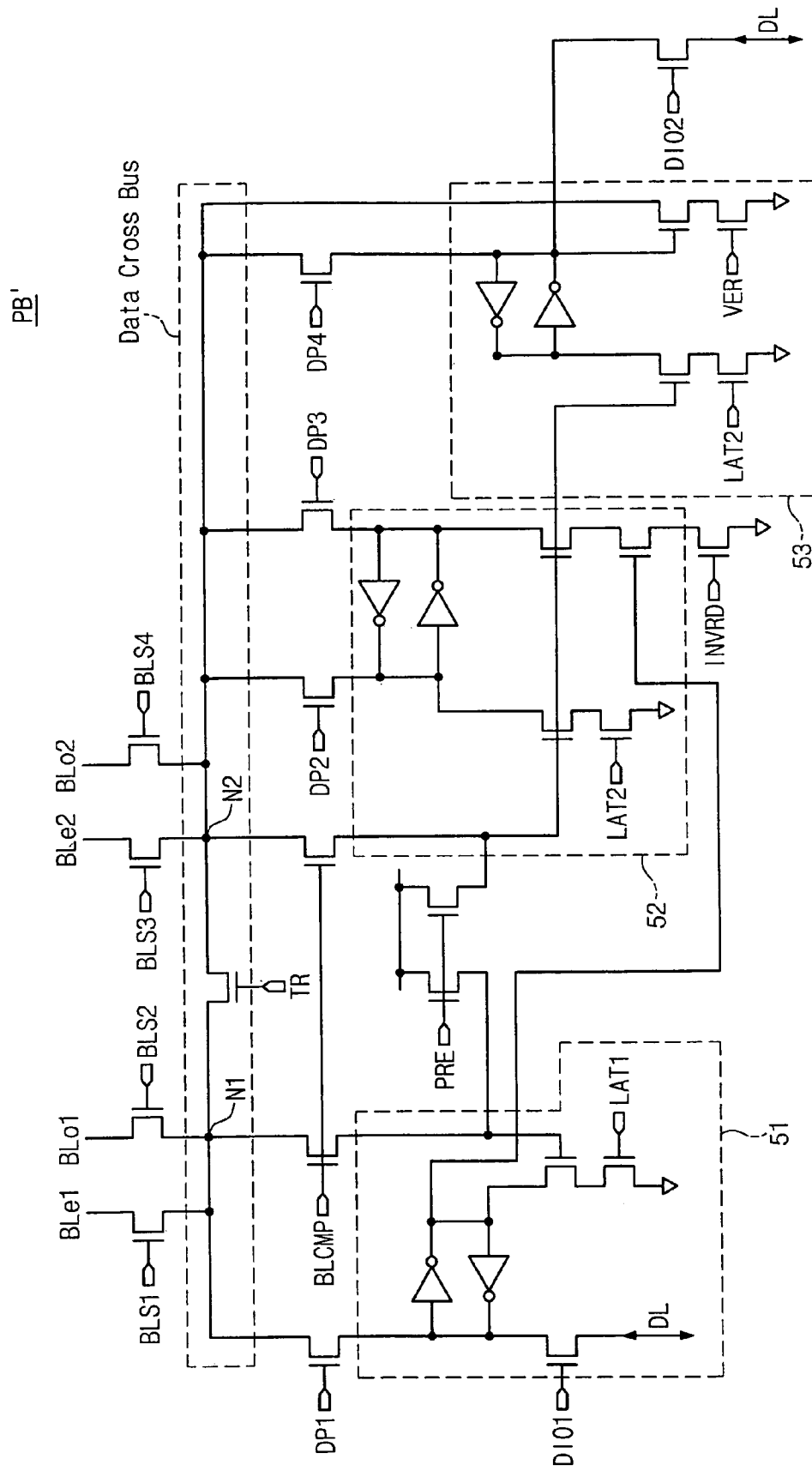
FIG. 16 is a circuit diagram illustrating a detailed structure of page buffer PB' shown in FIG. 14.

FIG. 15 is a block diagram illustrating a schematic structure of a page buffer PB' shown in FIG. 14, and FIG. 16 is a circuit diagram illustrating page buffer PB' in further detail.

Referring to FIGS. 14 through 16, page buffer PB' comprises three latches, i.e., first, second, and third latches 51, 52, and 53. Functions conducted by latches 51 through 53 are determined by control logic unit 190 on basis of a number of bits stored in corresponding memory cells. Information about the number of bits per cell is typically determined and set by control logic unit 190, e.g., based on state(s) of one or more fuses or data stored in one or more registers. Control logic unit 190 determines the functions of latches 51 through 53 by means of the set information. The functions of latches 51 through 53 on the basis of one or more memory blocks. First through third latches 51 through 53 are selectively connected to a data cross bus through respective first and second nodes N1 and N2. The number of latches connected to the data cross bus can be adjusted by control logic unit 190. The data cross bus provides an interface between page buffer circuit 150 and bit lines, or between page buffer circuit 150 and bit-line selection and bias circuit 140. Bit-line selection and bias circuit 140 operates to selectively connect the data cross bus with a bit line pair BLe1 and BLo1 coupled to a first memory cell Cell-1, and a bit line pair BLe1 and BLo2 coupled to a second memory cell Cell-2. Meanwhile, first and third latches 51 and 53 are connected to a data IO bus through a data line DL. The data IO bus provides a data interface between page buffer circuit 150 and an external system (or host). Data input/output operations by first and second latches 51 and 53 connected to the data IO bus are independent from each other. Accordingly, it is possible to assist a cache programming operation during a multi-bit programming operation.

FIG. 17 illustrates functions associated with first through third latches 51 through 53 included in the page buffer PB' shown in FIGS. 14 through 16.

Referring to FIG. 17, the number of bits stored in a memory cell corresponding to page buffer PB' determines the functions of first through third latches 51 through 53. First through third latches 51 through 53 may be connected each to bit line pairs BLe1/BLo1 and BLe2/BLo2 corresponding each to first and second memory cells Cell-1 and Cell-2, or connected to bit line pair BLe1/BLo1 or BLe2/BLo2 corresponding to one of first and second memory cells Cell-1 and Cell-2. Interconnections between first through third latches 51 through 53 and the functions carried out by first through third latches 51 through 53 are determined by control logic unit 190 in accordance with the number of bits stored in the corresponding memory cell (i.e., according to the results of fusing option or register setting).

As an example, where a unit memory cell stores 1-bit data (i.e., 2 levels), first latch 51 is used to conduct a programming or reading operation for one of first and second memory cells Cell-1 and Cell-2, while second latch 52 is used as a cache for storing data to be programmed next. Data held by first latch 51 is programmed through its corresponding bit line (i.e., an even or odd-ordered bit line connected to one of first and second memory cells Cell-1 and Cell-2). The programmed data is read out through first latch 51. On the other hand, where a unit memory cell stores 1.5-bit data (i.e., in relation to 3 threshold voltage distributions), i.e., where two memory cells collectively store 3-bit data, first latch 51 is used to conduct a programming or reading operation for first memory cell Cell-1, while second latch 52 is used to conduct a programming or reading operation for second memory cell Cell-2. Third latch 53 is used as a cache for storing data to be programmed next. The memory cell storing 1-bit or 1.5-bit data may be referred to as a single-bit memory cell.

Functions of latches 51 through 53 will now be described for cases where the corresponding memory cell stores 2-bit data (i.e., in relation to 4 threshold voltage distributions), or 3-bit data (i.e., in relation to 8 threshold voltage distributions). First latch 51 is used for programming or reading one of first and second memory cells Cell-1 and Cell-2, while second latch 52 is used for reading data that has been programmed just before a programming operation conducted using first latch 51, from first or second memory cell Cel-1 or Cell-2. Third latch 53 is used as a cache for storing data to be programmed next.

A multi-bit programming operation typically comprises multiple programming steps or cycles. Each programming step is carried out in conjunction with a previously programmed result and data to be programmed at present. Once the previously programmed result is read by second latch 52, program data (i.e., data to be programmed at present) loaded in first latch 51 is programmed into the corresponding memory cell. The memory cell storing multiple bits (e.g., 2, 2.5, or 3 bits) will be referred to as a multi-bit memory cell. Here, the functions associated with first and second latches 51 and 52 where the corresponding memory cell stores 2-bit data are also applicable where the corresponding memory cell stores more bits, e.g., 4, 8, or 16 bits.

Functions associated with latches 51 through 53 when storing 2.5-bit data (i.e., in relation to 6 threshold voltage distributions) will be described below. More particularly, the functions associated with latches 51 through 53 when storing 5 bits of data in a pair of 2.5-bit memory cells will be described. To begin, first and second latches 51 and 52 operate to store data to be programmed in first and second memory cells Cell-1 and Cell-2. During this, third latch 53 operates to read data from one or two pages programmed. Then, programming operations are carried out with data stored in first and second latches 51 and 52 with reference to a previously programmed result read by third latch 53 and data stored in first and second latches 51 and 52. The programming operations for first and second memory cells Cell-1 and Cell-2 are conducted simultaneously by way of first and second latches 51 and 52. The programmed data is read out also through first and second latches 51 and 52. Data stored in third latch 53 is used to differentiate data stored in first and second latches 51 and 52. This 6-level MLC programming operation carried out by page buffer circuit 250 of the triple latch structure will be described in further detail with reference to FIGS. 18 and 19.

Figure 18:
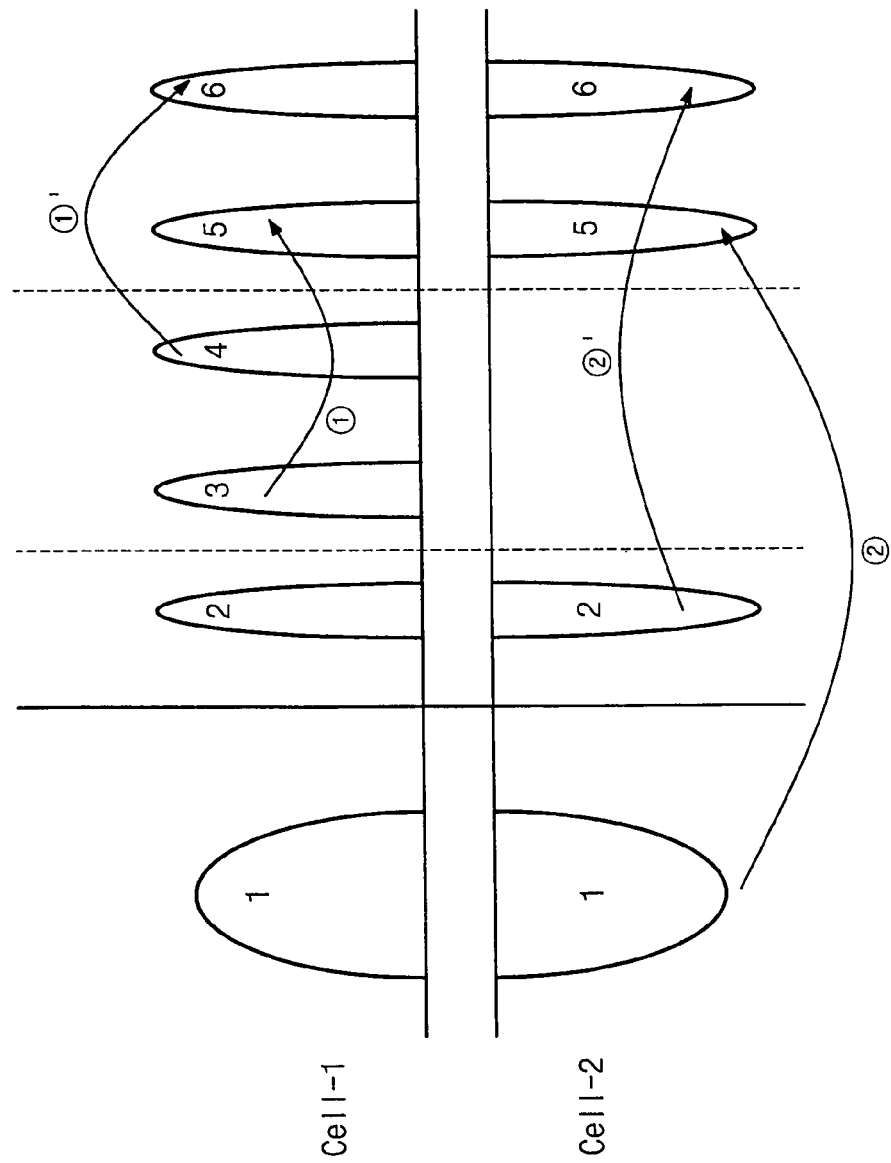
FIG. 18 shows variations of threshold voltages corresponding to a fourth stage of a 6-level MLC programming operation in the flash memory device shown in FIG. 14.
Figure 19:
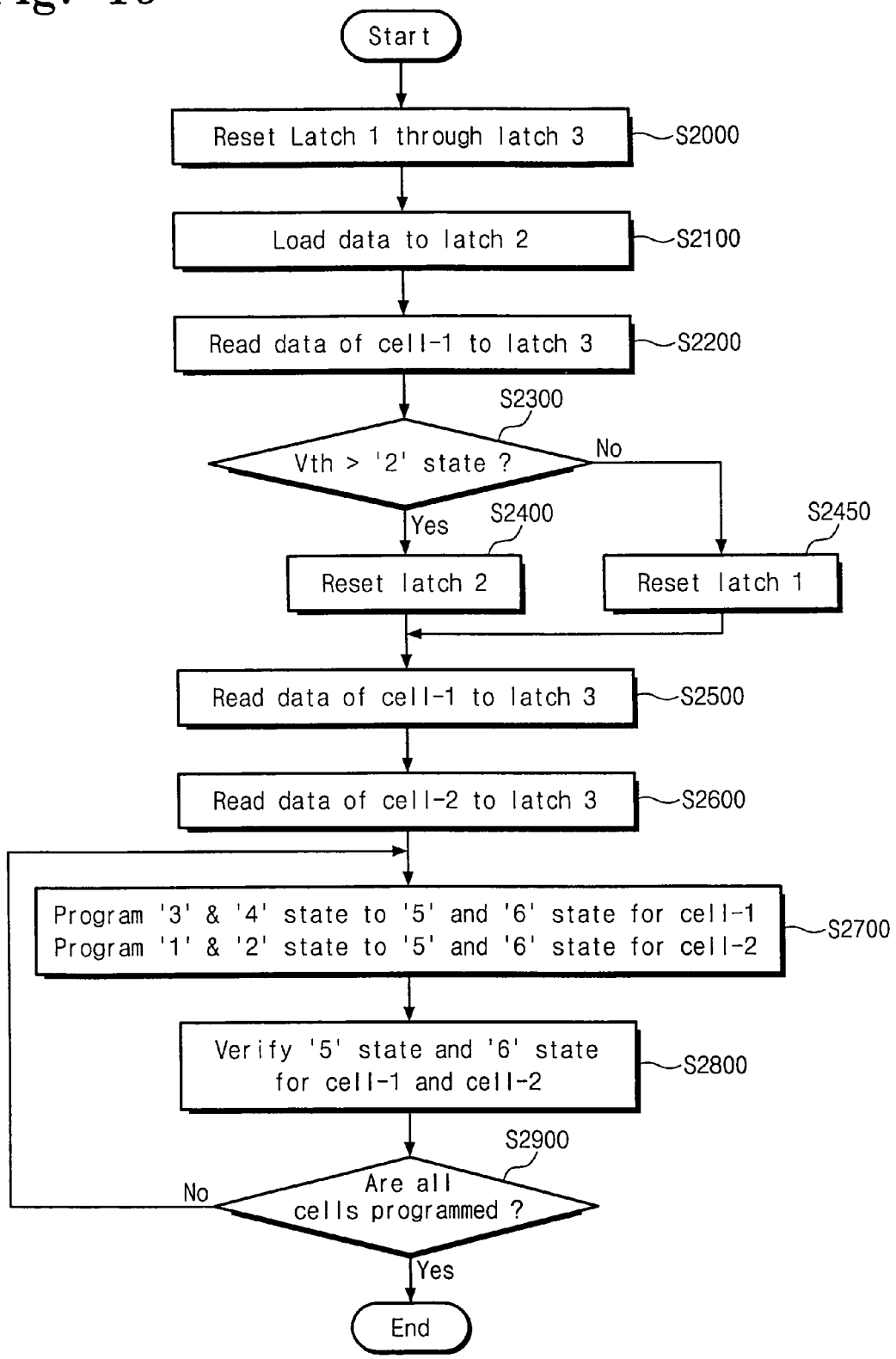
FIG. 19 is a flow chart showing the fourth stage of the 6-level MLC programming operation in the flash memory device shown in FIG. 14.

FIG. 18 shows variations of threshold voltages corresponding to a fourth stage of the 6-level MLC programming operation in the flash memory device shown in FIG. 14, and FIG. 19 is a flow chart illustrating the fourth stage of the 6-level MLC programming operation. FIGS. 18 and 19 illustrate the 6-level MLC programming operation carried out by page buffer circuit 250 with the triple latch structure shown in FIGS. 14 through 16. The 6-level MLC programming operation is conducted to store 2.5-bit data in a memory cell, by which two memory cells store 5-bit data in total. Therefore, FIGS. 18 and 19 illustrate variations of threshold voltages and programming features in two memory cells, e.g., first and second memory cells Cell-1 and Cell-2.

First, referring to FIG. 18, the fourth stage of the 6-level MLC programming operation is composed of four programming steps. These four programming steps are simultaneously carried out by triple-latch page buffer circuit 250 for first and second memory cells Cell-1 and Cell-2 (see, arrows labeled 1, 1', 2, and 2'). Otherwise, verifying steps for the four programming steps conducted at the same time are individually carried out. Namely, the fourth stage of the 6-level MLC programming operation by triple-latch page buffer circuit 250 is composed of one cycle of programming and four cycles of program-verifying. Here, the program-verifying steps (or cycles) are individually carried out, not simultaneously, due to characteristics of voltages applied to bit lines while reading adjacent memory cells thereof. A more detailed procedure for programming first and second memory cells Cell-1 and Cell-2 is provided below.

Referring to FIG. 19, first through third latches 51 through 53 are reset or initialized (S2000) before the first programming step of the fourth stage. Program data are loaded into first and second latches 51 and 52 (S2100). Subsequently, data programmed in the first memory cell Cell-1 is read out through the third latch 53 (S2200). Then, it is determined whether the data programmed in first memory cell Cell-1 is higher than data state '2' in threshold voltage with reference to the data read out by S2200 (S2300).

Based on the determination made in step S2300, if the data programmed in first memory cell Cell-1 is higher than data state '2' in terms of its threshold voltage, second latch 52 is initialized to data state '1' (S2400). The condition that the data programmed in first memory cell Cell-1 is higher than data state '2' means that first memory cell Cell-1 is storing data state '3' or '4'. In this case, first latch 51 is set to be used for programming first memory cell Cell-1, and second latch 52 is set to be used for programming second memory cell Cell-2.

On the other hand, based on the determination made in step S2300, if the data programmed in first memory cell Cell-1 is lower than data state '2', first latch 51 is initialized (S2450). The condition that the data programmed in first memory cell Cell-1 is lower than data state '2' means that first memory cell Cell-1 is storing data state '1' or '2'. In this case, first latch 51 is storing data state '3' or '4'. Thus, first latch 51 is set to be used for programming first memory cell Cell-1, and second latch 52 is set to be used for programming second memory cell Cell-2. As mentioned previously, the programmed state of first memory cell Cell-1, which is read thereinto during step S2200, is used to set functions of first and second latches 51 and 52.

Data programmed in first memory cell Cell-1 is read out through third latch 53 (S2500). Data read out in step S2500 determines that data stored in first memory cell Cell-1 is in data state '3' or '4' (or in data state '1' or '2'). Then, data programmed in second memory cell Cell-2 is read out through third latch 53 (S2600). The data read out in step S2600 determines that data stored in second memory cell Cell-2 is in data state '1' or '2' (or in the data state '3' or '4').

Subsequently, with reference to the data read out in steps S2500 and S2600 and the program data loaded into first and second latches 51 and 52, the four programming steps shown in FIG. 18 (see, arrows labeled 1, 1', 2, and 2') are simultaneously carried out for first and second memory cells Cell-1 and Cell-2 (S2700). The programming operation in step S2700 is designed to execute steps 1' and 2' at the same by means of incremental program voltages after completing the steps indicated by the respective arrows labeled 1 and 2. For instance, in step S2700, after programming first memory cell Cell-1 from data state '3' (or '1') to data state '5', data state '4' (or '2') is programmed to data state '6' by means of gradually stepping-up program voltages. At the same time, after programming second memory cell Cell-2 from data state '1' (or '3') to data state '5', the data state '2' (or '4') is programmed to data state '6' by means of gradually stepping-up program voltages. After completing the programming sequence in step S2700, the device verifies whether first and second memory cells Cell-1 and Cell-2 have been successfully programmed (S2800).

The program-verifying operation performed in step S2800 is composed of four steps in total corresponding to the arrows labeled 1, 1', 2, and 2' in FIG. 18. For instance, after determining whether first memory cell Cell-1 has been successfully programmed into data state '5' (corresponding to the arrow labeled 1), it is determined whether second memory cell Cell-2 has been successfully programmed into data state '5' (corresponding to the arrow labeled 2). Then, after determining whether first memory cell Cell-1 has been successfully programmed into data state '6' (corresponding to the arrow labeled 1'), it is determined whether second memory cell Cell-2 has been successfully programmed into data state '6' (corresponding to the arrow labeled 2').

After completing the sequence of the four program-verifying steps of step S2800, it is determined whether all memory cells have been successfully programmed (S2900). From a result of the determination made in step S2900, if all memory cells have been completely programmed, the procedure is terminated. If all memory cells have not been completely programmed yet, the procedure returns to step S2700 and repeats the programming and program-verifying operations.

As mentioned previously, flash memory device 200 is configured to control the functions of the latches included in page buffer PB or PB' in accordance with a result of conversion with the number of bits stored in corresponding memory cells (e.g., as indicated by state(s) of one or more fuses or data stored in one or more registers). The latches may be designed to have different functions on a memory block by memory block basis or on the basis of groups of multiple memory blocks. Especially, the latches may be selectively connected to the data cross bus by control logic unit 190, individually conducting data input/output operations. Therefore, it is possible to enable the latches to operate at the same time and to assist a cache programming operation during a multi-bit programming mode. As a result, selected embodiments of the invention can be applied to various types of memory cells, e.g., various kinds of multi-bit memory cells in the number of bits stored therein, even with the same page buffer circuit, which contributes to reducing a chip size of the flash memory device.

Embodiments of the invention provide flexibility among conventional flash memory devices even without altering or modifying peripheral circuits, control scheme of file system, or block size, providing facilities in programming, erasing, and reading various types of multi-bit memory cells.

Moreover, page buffer circuits and flash memory devices provided in accordance with various embodiments of the present invention allow flexibility in programming, erasing, and reading operations even when the number of bits per cell varies, which results in effective reduction of a chip size.

The foregoing exemplary embodiments are teaching examples. Those of ordinary skill in the art will understand that various changes in form and details may be made to the exemplary embodiments without departing from the scope of the invention as defined by the following claims.

What is claimed:

1. A flash memory device, comprising:
   a memory cell array comprising first type memory cells capable of storing m-bit data and second type memory cells capable of storing n-bit data, where n is not equal to m;
   a page buffer circuit comprising a plurality of page buffers adapted to operate in programming, erasing, and reading operations of the first and second type memory cells; and
   a control logic unit adapted to determine respective functions performed by the page buffers based on whether each page buffer is associated with first type memory cells or second type memory cells;
   wherein each page buffer comprises a plurality of latches adapted to store data for different purposes during programming and reading operations depending on the data storage capacities of corresponding memory cells among the first and second type memory cells,
   each one of the plurality of latches is further adapted to operate in relation to a selected one of a plurality of variable data storage functions, and
   the selection of the one variable data storage function is determined by the control logic unit in relation to the data storage capacities of corresponding memory cells among the first and second type memory cells.

2. The flash memory device of claim 1, wherein the plurality of latches are selectively connected to the first and second type memory cells under the control of the control logic unit.

3. The flash memory device of claim 1, wherein the plurality of latches independently interface with the first and second type memory cells.

4. The flash memory device of claim 1, wherein the plurality of latches in each page buffer comprises first and second latches each operating in relation to a selected one of the variable data storage functions as determined by the control logic unit in relation to the data storage capacities of corresponding memory cells among the first and second type memory cells.

5. The flash memory device of claim 4, wherein where two memory cells corresponding to a particular page buffer among the plurality of page buffers each store 1-bit data, the first latch of the particular page buffer stores program and read data for a selected memory cell and the second latch of the particular page buffer acts as a cache for transferring the program data to the first latch of the particular page buffer.

6. The flash memory device of claim 4, wherein where two memory cells corresponding to a particular page buffer among the plurality of page buffers each store 1.5-bit data, the first latch of the particular page buffer stores program and read data for a first one of the two memory cells and the second latch of the particular page buffer stores program and read data for a second one of the two memory cells.

7. The flash memory device of claim 4, wherein where two memory cells corresponding to a particular page buffer among the plurality of page buffers each store 2-bit data, the first latch of the particular page buffer stores program and read data for a first one of the two memory cells while the second latch of the particular page buffer reads and stores data stored in the first one of the memory cells before programming the data stored in the first latch of the particular page buffer.

8. The flash memory device of claim 4, wherein where two memory cells corresponding to a particular page buffer among the plurality of page buffers each store 2.5-bit data, the first latch of the particular page buffer stores program and read data for a first one of the two memory cells and the second latch of the page buffer reads and stores data stored in a second one of the two memory cells before programming the data stored in the first latch of the particular page buffer.

9. The flash memory device of claim 4, wherein where two memory cells corresponding to a particular page buffer among the plurality of page buffers each store 3-bit data, the first latch of the particular page buffer stores program and read data for a first one of the two memory cells and the second latch of the particular page buffer reads and stores data stored in the first one of the two memory cells before programming the data stored in the first latch of the particular page buffer.

10. The flash memory device of claim 4, wherein where two memory cells corresponding to a particular page buffer among the plurality of page buffers each store $2^n$-bit data (n is an integer greater than or equal to zero), the first latch of the particular page buffer stores program and read data for a first one of the two memory cells and the second latch of the particular page buffer reads and stores data stored in the first one of the two memory cells before programming the data stored in the first latch of the particular page buffer.

11. The flash memory device of claim 1, wherein the plurality of latches in each page buffer comprises first through third latches having variable data storage functions based on the data storage capacities of corresponding memory cells among the first and second type memory cells.

12. The flash memory device of claim 11, wherein where two memory cells corresponding to a particular page buffer among the plurality of page buffers each store 1-bit data, the first latch of the particular page buffer stores program and read data for a selected memory cell and the second latch of the particular page buffer acts as a cache for transferring the program data to the first latch of the particular page buffer.

13. The flash memory device of claim 11, wherein where two memory cells corresponding to a particular page buffer among the plurality of page buffers each store 1.5-bit data, the first latch of the particular page buffer stores program and read data for a first one of the two memory cells, the second latch of the particular page buffer stores program and read data for a second one of the two memory cells, and the third latch of the particular page buffer acts as a cache for transferring the program data to the first and second latches of the particular page buffer.

14. The flash memory device of claim 11, wherein where two memory cells corresponding to a particular page buffer among the plurality of page buffers each store 2-bit data, the first latch of the particular page buffer stores program and read data for a first one of the two memory cells, the second latch reads and stores data stored in the first one of the two memory cells before programming the data stored in the first latch of the particular page buffer, and the third latch acts as a cache for transferring the program data to the first latch of the particular page buffer.

15. The flash memory device of claim 11, wherein where two memory cells corresponding to a particular page buffer among the plurality of page buffer each store 2.5-bit data, the first latch of the particular page buffer stores program and read data for a first one of the two memory cells, the second latch of the particular page buffer stores program and read data for a second one of the two memory cell, and the third latch of the particular page buffer stores data for differentiating between the program data stored in the first and second latches of the particular page buffer.

16. The flash memory device of claim 11, wherein where two memory cells corresponding to a particular page buffer among the plurality of page buffers each store 3-bit data, the first latch of the particular page buffer stores program and read data for a first one of the two memory cells, the second latch of the particular page buffer reads and stores data stored in the first one of the two memory cells before programming the data stored in the first latch one of the two memory cells, and the third latch of the particular page buffer acts as a cache for transferring the program data to the first latch of the particular page buffer.

17. The flash memory device of claim 11, wherein where two memory cells corresponding to a particular page buffer among the plurality of page buffers each store 2n-bit data, the first latch of the particular page buffer stores program and read data for a first one of the two memory cells, the second latch of the particular page buffer reads and stores data stored in the first one of the two memory cells before programming the data stored in the first latch of the particular page buffer, and the third latch of the particular page buffer acts as a cache for transferring the program data to the first latch of the particular page buffer.

18. The flash memory device of claim 1, wherein the type of memory cells corresponding to each page buffer is indicated by a state of one or more fuses or by data stored in one or more registers in the flash memory device.

19. The flash memory device of claim 1, wherein the first and second type memory cells are NAND flash memory cells.

20. The flash memory device of claim 1, wherein the first and second type memory cells are NOR flash memory cells.

21. A flash memory device, comprising:
a memory cell array comprising first type memory cells capable of storing m-bit data and second type memory cells capable of storing n-bit data, where n is not equal to m;
a page buffer circuit comprising a plurality of page buffers adapted to operate in programming, erasing, and reading operations of the first and second type memory cells; and
a control logic unit adapted to determine respective functions performed by the page buffers based on whether each page buffer is associated with first type memory cells or second type memory cells;
wherein each page buffer comprises a plurality of latches adapted to store data for different purposes during programming and reading operations depending on the data storage capacities of corresponding memory cells among the first and second type memory cells,
wherein the memory cell array comprises a plurality of memory blocks each comprising a plurality of pages and the number and type of memory cells connected to each page buffer varies on a memory block by memory block basis or on the basis of a unit larger than a single memory block.

22. The flash memory device of claim 21, wherein each memory block comprises a bit line connected to at least two or more memory cells adapted to store different number of bits from each other.

23. The flash memory device of claim 21, wherein each block comprises $2^n$ pages, where n is an integer greater than or equal to zero.

24. The flash memory device of claim 22, wherein the bit line is connected to at least one memory cell adapted to store $2^n$-bit data, where n is an integer greater than or equal to zero.

25. The flash memory device of claim 22, wherein the bit line is connected to a memory cell adapted to store a number of data bits not equal to a power of two.

26. The flash memory device of claim 22, wherein the bit line is connected to a dummy cell.

27. The flash memory device of claim 22, wherein the bit line is connected to a number of memory cells that varies according to a condition that the number of pages in each memory block is $2^n$, where n is an integer greater than or equal to zero.

28. The flash memory device of claim 22, wherein the bit line in at least one memory block is connected to a number of memory cells equal to $2^n$ for some integer value of n greater than or equal to zero and the at least one memory block has a number of pages that can be varied without a constraint that the number of pages be equal to $2^n$ for some integer value of n.

29. The flash memory device of claim 22, wherein each memory block contains the same type and number of memory cells.

* * * * *